(12) United States Patent
Hwang et al.

(10) Patent No.: US 9,093,588 B2
(45) Date of Patent: Jul. 28, 2015

(54) SEMICONDUCTOR LIGHT EMITTING DEVICE WITH AN ALUMINUM CONTAINING LAYER FORMED THEREON

(75) Inventors: Jongil Hwang, Kanagawa-ken (JP); Shinji Saito, Kanagawa-ken (JP); Maki Sugai, Tokyo (JP); Rei Hashimoto, Tokyo (JP); Yasushi Hattori, Kanagawa-ken (JP); Masaki Tohyama, Kanagawa-ken (JP); Shinya Nunoue, Chiba-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 657 days.

(21) Appl. No.: 13/032,907

(22) Filed: Feb. 23, 2011

(65) Prior Publication Data

US 2012/0007113 A1    Jan. 12, 2012

(30) Foreign Application Priority Data

Jul. 8, 2010   (JP) .................. 2010-155591

(51) Int. Cl.
*H01L 33/26* (2010.01)
*H01L 33/06* (2010.01)
*H01L 33/32* (2010.01)

(52) U.S. Cl.
CPC .............. *H01L 33/06* (2013.01); *H01L 33/32* (2013.01)

(58) Field of Classification Search
USPC .............. 257/94, 98, 100, E33.013, E33.048
See application file for complete search history.

(56) References Cited

U.S. PATENT DOCUMENTS 6,121,638 A *  9/2000  Rennie et al. ............... 257/103
2010/0187497 A1 * 7/2010  Nago et al. ................. 257/13

FOREIGN PATENT DOCUMENTS

| JP | 10-145004 | 5/1998 |
| JP | 2002-100838 | 4/2002 |
| JP | 2002-335052 | 11/2002 |
| JP | 2006-245165 | 9/2006 |
| JP | 2007-19399 | 1/2007 |

OTHER PUBLICATIONS

Office Action issued Dec. 26, 2012, in Japanese Patent Application No. 2010-155591 with English translation.
U.S. Appl. No. 12/875,503, filed Sep. 3, 2010, Toshiki Hikosaka et al.
Office Action issued Apr. 13, 2012 in Japan Application No. 2010-155591 (With English Translation).
U.S. Appl. No. 13/803,563, filed Mar. 14, 2013, Kimura, et al.
U.S. Appl. No. 13/826,787, filed Mar. 14, 2013, Hwang, et al.

* cited by examiner

*Primary Examiner* — Lynne Gurley
*Assistant Examiner* — Vernon P Webb
(74) *Attorney, Agent, or Firm* — Oblon, McClelland, Maier & Neustadt, L.L.P.

(57) ABSTRACT

According to one embodiment, a semiconductor light emitting device includes an n-type semiconductor layer, a p-type semiconductor layer, a well layer, a barrier layer, an Al-containing layer, and an intermediate layer. The p-type semiconductor layer is provided on a side of [0001] direction of the n-type semiconductor layer. The well layer, the barrier layer, the Al-containing layer and the intermediate layer are disposed between the n-type semiconductor layer and the p-type semiconductor layer subsequently. The Al-containing layer has a larger band gap energy than the barrier layer, a smaller lattice constant than the n-type semiconductor layer, and a composition of $Al_{x1}Ga_{1-x1-y1}In_{y1}N$. The intermediate layer has a larger band gap energy than the well layer, and has a first portion and a second portion provided between the first portion and the p-type semiconductor layer. A band gap energy of the first portion is smaller than that of the second portion.

23 Claims, 14 Drawing Sheets

US 9,093,588 B2

SEMICONDUCTOR LIGHT EMITTING DEVICE WITH AN ALUMINUM CONTAINING LAYER FORMED THEREON

CROSS-REFERENCE TO RELATED APPLICATION

This application is based upon and claims the benefit of priority from Japanese Patent Application No. 2010-155591, filed on Jul. 8, 2010; the entire contents of which are incorporated herein by reference.

FIELD

Embodiments described herein relate generally to a semiconductor light emitting device.

BACKGROUND

A need for improvement of luminous efficiency in semiconductor light emitting devices such as Laser Diodes (LD), Light Emitting Diodes (LED) and the like is desired.

For example, various configurations have been proposed to suppress electron overflow in active layers in order to improve luminous efficiency. However, there is still room for further improvement of luminous efficiency.

DETAILED DESCRIPTION

Figure 1:
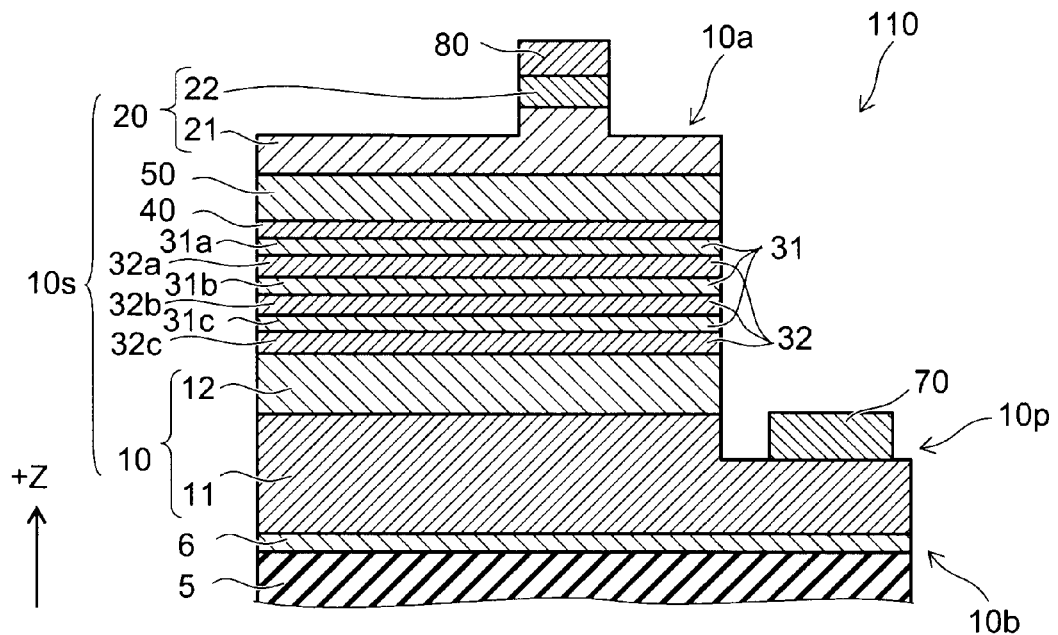
FIG. 1 is a schematic cross-sectional view illustrating a semiconductor light emitting device according to an embodiment.

According to one embodiment, a semiconductor light emitting device includes an n-type semiconductor layer, a p-type semiconductor layer, a first well layer, a first barrier layer, an Al-containing layer, and an intermediate layer. The n-type semiconductor layer includes a nitride semiconductor. The p-type semiconductor layer is provided on a side of [0001] direction of the n-type semiconductor layer and includes a nitride semiconductor. The first well layer is provided between the n-type semiconductor layer and the p-type semiconductor layer. The first well layer has a band gap energy smaller than a band gap energy of the n-type semiconductor layer and smaller than a band gap energy of the p-type semiconductor layer, and includes a nitride semiconductor. The first barrier layer is provided between the first well layer and the n-type semiconductor layer, and is in contact with the first well layer. The first barrier layer has a band gap energy larger than the band gap energy of the first well layer, and includes a nitride semiconductor. The Al-containing layer is provided between the first well layer and the p-type semiconductor layer, and is in contact with the first well layer. The Al-containing layer has a band gap energy larger than the band gap energy of the first barrier layer, has a lattice constant smaller than a lattice constant of the n-type semiconductor layer, and has a composition of $Al_{x1}Ga_{1-x1-y1}In_{y1}N$ (where $0<x1<1$ and $0 \leq y1<1$). The intermediate layer is provided between the Al-containing layer and the p-type semiconductor layer, is in contact with the Al-containing layer, has a band gap energy larger than the band gap energy of the first well layer, and includes a nitride semiconductor. The intermediate layer has a first portion and a second portion provided between the first portion and the p-type semiconductor layer. A band gap energy of the first portion is smaller than a band gap energy of the second portion.

An embodiment of the invention will now be described with reference to the drawings.

Drawings are schematic or simplified illustrations and that relationships between thicknesses and widths of parts and proportions in size between parts may differ from actual parts. Also, even where identical parts are depicted, mutual dimensions and proportions may be illustrated differently depending on the drawing.

Drawings and specification of this application, the same numerals are applied to constituents that have already appeared in the drawings and been described, and repetitious detailed descriptions of such constituents are omitted as appropriate.

FIG. 1 is a schematic cross-sectional view illustrating a configuration of a semiconductor light emitting device according to an embodiment.

As illustrated in FIG. 1, a semiconductor light emitting device 110 according to the embodiment includes an n-type semiconductor layer 10, a p-type semiconductor layer 20, a first well layer 31a, a first barrier layer 32a, an Al-containing layer 40, and an intermediate layer 50.

The n-type semiconductor layer 10 includes a nitride semiconductor.

The p-type semiconductor layer 20 is provided in a side of [0001] direction of the n-type semiconductor layer 10. The p-type semiconductor layer 20 includes a nitride semiconductor.

The first well layer 31a is provided between the n-type semiconductor layer 10 and the p-type semiconductor layer 20. The first well layer 31a has a band gap energy smaller than a band gap energy of the n-type semiconductor layer 10 and smaller than a band gap energy of the p-type semiconductor layer 20. The first well layer 31a includes a nitride semiconductor.

The first barrier layer 32a is provided between the first well layer 31a and the n-type semiconductor layer 10 and is in contact with the first well layer 31a. The first barrier layer 32a has a band gap energy larger than the band gap energy of the first well layer 31a. The first well layer 31a includes a nitride semiconductor.

The Al-containing layer 40 is provided between the first well layer 31a and the p-type semiconductor layer 20 and is in contact with the first well layer 31a. The Al-containing layer 40 has a band gap energy larger than the band gap energy of the first barrier layer 32a. The Al-containing layer 40 has a lattice constant that is smaller than a lattice constant of the n-type semiconductor layer 10. A composition of the Al-containing layer 40 is $Al_{x1}Ga_{1-x1-y1}In_{y1}N$ (where 0<x1<1 and 0≤y1<1).

$Al_{x1}Ga_{1-x}N$ (where 0.001≤x1<0.3) is used, for example, for the Al-containing layer 40.

The intermediate layer 50 is provided between the Al-containing layer 40 and the p-type semiconductor layer 20 and is in contact with the Al-containing layer 40. The intermediate layer 50 has a band gap energy larger than the band gap energy of the first well layer 31a. The intermediate layer 50 includes nitride semiconductor.

A band gap energy of a portion on the n-type semiconductor layer 10 side of the intermediate layer 50 is smaller than a band gap energy of a portion on the p-type semiconductor layer 20 side of the intermediate layer 50.

The band gap energy of the intermediate layer 50 is smaller than or equal to the band gap energy of the p-type semiconductor layer 20. In other words, the band gap energy of the portion (the first portion) on the n-type semiconductor layer 10 side of the intermediate layer 50 is smaller than or equal to the band gap energy of the p-type semiconductor layer 20.

Undoped InGaN, for example, is used for the intermediate layer 50. In the intermediate layer 50, by setting an In composition ratio of the portion on the Al-containing layer 40 side to be higher than that of the portion on the p-type semiconductor layer 20 side, the band gap energy of the portion on the n-type semiconductor layer 10 side of the intermediate layer 50 is set smaller than the band gap energy of the portion on the p-type semiconductor layer 20 side of the intermediate layer 50.

For example, the band gap energy of the intermediate layer 50 increases with movement from the n-type semiconductor layer 10 side to the p-type semiconductor layer 20 side.

In this embodiment, the semiconductor light emitting device 110 further includes a second well layer 31b, a second barrier layer 32b, a third well layer 31c, and a third barrier layer 32c.

The second well layer 31b is provided between the first barrier layer 32a and the n-type semiconductor layer 10 and is in contact with the first barrier layer 32a. The second well layer 31b has a band gap energy smaller than the band gap energy of the first barrier layer 32a, smaller than the band gap energy of the Al-containing layer 40, and smaller than the band gap energy of the intermediate layer 50. The second well layer 31b includes a nitride semiconductor.

The second barrier layer 32b is provided between the second well layer 31b and the n-type semiconductor layer 10 and is in contact with the second well layer 31b. The second barrier layer 32b has a band gap energy larger than the band gap energy of the second well layer 31b and smaller than the band gap energy of the Al-containing layer 40. The second barrier layer 32b includes a nitride semiconductor.

The third well layer 31c is provided between the second barrier layer 32b and the n-type semiconductor layer 10 and is in contact with the second barrier layer 32b. The third well layer 31c has a band gap energy smaller than the band gap energy of the second barrier layer 32b, smaller than the band gap energy of the Al-containing layer 40, and smaller than the band gap energy of the intermediate layer 50. The third well layer 31c includes a nitride semiconductor.

The third barrier layer 32c is provided between the third well layer 31c and the n-type semiconductor layer 10 and is in contact with the third well layer 31c. The third barrier layer 32c has a band gap energy larger than the band gap energy of the third well layer 31c and smaller than the band gap energy of the Al-containing layer 40. The third barrier layer 32c includes a nitride semiconductor.

In this example, a Multi Quantum Well structure provided with three of the well layers 31 is used. However, the embodiment is not limited thereto, and the number of the well layers 31 in the Multi Quantum Well structure can be set as desired. In the embodiment, a Single Quantum Well structure having one of the well layers 31 may be used.

When providing a plurality of the well layers 31, the number of the well layers 31 is defined as well layer number N (where N is an integer greater than or equal to 2). A first of the well layers 31 is disposed on the side closest to the p-type semiconductor layer 20 among the plurality of the well layers 31. An Nth of the well layers 31 is disposed on the side closest to the n-type semiconductor layer 10 among the plurality of the well layers 31. The first well layer 31a to the Nth well layer are collectively referred to as the well layers 31. Each of the plurality of the well layers 31 correspond with the first well layer 31a, the second well layer 31b, the third well layer 31c, and the like.

The barrier layers 32 are provided on the n-type semiconductor layer 10 side of each of the plurality of the well layers 31. In other words, an Nth barrier layer is provided on the n-type semiconductor layer 10 side of the Nth well layer. The first barrier layer 32a to the Nth barrier layer are collectively referred to as the barrier layers 32. Each of the plurality of the barrier layers 32 correspond with the first barrier layer 32a, the second barrier layer 32b, the third barrier layer 32c, and the like.

The Nth well layer is provided between an (N−1)th barrier layer and the n-type semiconductor layer 10 and is in contact with the (N−1)th barrier layer. The Nth well layer has a band gap energy smaller than the band gap energy of the (N−1)th barrier layer, smaller than the band gap energy of the Al-containing layer 40, and smaller than the band gap energy of the intermediate layer 50. The Nth well layer includes a nitride semiconductor.

The Nth barrier layer is provided between the Nth well layer and the n-type semiconductor layer 10 and is in contact with the Nth well layer. The Nth barrier layer has a band gap energy larger than the band gap energy of the Nth well layer and smaller than the band gap energy of the Al-containing layer 40. The Nth barrier layer includes a nitride semiconductor.

The band gap energy of the Al-containing layer 40 is larger than the band gap energy of the Nth barrier layer. The band gap energy of the intermediate layer 50 is larger than the band gap energy of the Nth well layer.

$In_wGa_{1-w}N$ (where $0<w\leq1$) is used, for example, for the well layers 31 (i.e., the first well layer 31a etc.). An In composition ratio of the well layers 31 (well layer In composition ratio w) is, for example, not less than 0.01 and not more than 0.5. The well layer In composition ratio w is, for example, 0.07. $In_{0.07}Ga_{0.93}N$ is used, for example, for the well layers 31.

$Al_{b2}In_{b1}Ga_{1-b1-b2}N$ (where $0\leq b1<1$, $0\leq b2<1$ and $0\leq b1+b2\leq1$) is used, for example, for the barrier layers 32 (i.e., the first barrier layer 32a etc.). An In composition ratio of the barrier layers 32 (barrier layer In composition ratio b1) is, for example, not less than 0.005 and is not more than the well layer In composition ratio w. The barrier layer In composition ratio b1 is, for example, 0.01. A barrier layer Al composition ratio b2 is, for example, 0. $In_{0.01}Ga_{0.99}N$ is used, for example, for the barrier layers 32.

Thereby the band gap energy of the barrier layer 32 becomes larger than the band gap energy of the well layers 31.

However, the embodiment is not limited thereto, and compositions of the well layers 31 and the barrier layer 32 may be varied as desired as long as the band gap energy of the well layers 31 is smaller than the band gap energy of the barrier layer 32.

A thickness of the well layers 31 is, for example, not less than 1 nanometer (nm) and not more than 10 nm. If the thickness of the well layers 31 is less than 1 nm, the characteristics of confining carriers in the well layers 31 will be reduced and a high luminous efficiency will not be obtained. If the thickness of the well layers 31 exceeds 10 nm, the crystal will degrade significantly. A thickness of the well layers 31 is, for example, 3 nm.

A thickness of the barrier layers 32 is, for example, 3 nm or more. If the thickness of the barrier layer 32 is less than 3 nm, the characteristics of confining carriers in the well layers 31 will be reduced and a high luminous efficiency will not be obtained. A thickness of the barrier layers 32 is, for example, 10 nm.

The wavelength (for example, a dominant wavelength) of the light emitted from the well layers 31 (i.e., the first well layer 31a etc.) is not less than 330 nm and not more than 580 nm. Conditions of the material used for the well layers 31 are set appropriately so that such light will be emitted.

Here, as illustrated in FIG. 1, a direction from the n-type semiconductor layer 10 toward the p-type semiconductor layer 20 is defined as the +Z-axis direction. The p-type semiconductor layer 20 is disposed in the +Z-axis direction of the n-type semiconductor layer 10.

A plane on a side of the +Z-axis direction of the n-type semiconductor layer 10 is, for example, a (0001) plane. The first barrier layer 32a is provided on a side of this (0001) plane, the first well layer 31a is provided on the side of the +Z-axis direction of the first barrier layer 32a, the Al-containing layer 40 is provided on a side of the +Z-axis direction of the first well layer 31a, the intermediate layer 50 is provided on a side of the +Z-axis direction of the Al-containing layer 40, and the p-type semiconductor layer 20 is provided on a side of the +Z-axis direction of the intermediate layer 50.

However, the plane of the side of the +Z-axis direction of the n-type semiconductor layer 10 need not be an exact (0001) plane, and may be a plane inclined from the exact (0001) plane at an offset angle. This offset angle is, for example, not less than 0 degrees and not more than 3 degrees. The state where the p-type semiconductor layer 20 is provided on the side of the [0001] direction of the n-type semiconductor layer 10 includes such cases where the face in the +Z-axis direction of the n-type semiconductor layer 10 is inclined from the (0001) plane.

As illustrated in FIG. 1, the crystal of the n-type semiconductor layer 10 is grown on a buffer layer 6 provided on a major surface of a substrate 5 that is, for example, a c-plane sapphire substrate. Moreover, crystals of the first barrier layer 32a, the first well layer 31a, the Al-containing layer 40, the intermediate layer 50, and the p-type semiconductor layer 20 are subsequently grown on the n-type semiconductor layer 10. In the semiconductor light emitting device 110, the substrate 5 and the buffer layer 6 are provided, but after the growing of the crystals described above, the substrate 5 and the buffer layer 6 may be removed.

In this example, the n-type semiconductor layer 10 has an n-side contact layer 11 provided on the substrate 5 side and an n-side cladding layer 12 provided on the first barrier layer 32a side. A portion of the n-side contact layer 11 is exposed, and an n-side electrode 70 is provided so as to be electrically connected to the n-side contact layer 11.

The p-type semiconductor layer 20 has a p-side cladding layer 21 provided on the intermediate layer 50 side and a p-side contact layer 22 provided on the side of the p-side cladding layer 21 opposite the intermediate layer 50. A p-side electrode 80 is provided so as to be electrically connected to the p-side contact layer 22.

Thereby, the semiconductor light emitting device 110 includes a stacked structural body 10s. The stacked structural body 10s includes the n-type semiconductor layer 10, the p-type semiconductor layer 20, and the light emitting part (for example, the first barrier layer 32a, the first well layer 31a, the Al-containing layer 40, and the intermediate layer 50) provided between the n-type semiconductor layer 10 and the p-type semiconductor layer 20. The stacked structural body 10s has a first major surface 10a of the p-type semiconductor layer 20 side, and a second major surface 10b of the n-type semiconductor layer 10 side.

In this example, the p-type semiconductor layer 20 and the light emitting part are selectively removed, and a portion 10p of the n-type semiconductor layer 10 (a portion of the n-side contact layer 11) is exposed to the first major surface 10a of the stacked structural body 10s. The n-side electrode 70 is provided on the exposed portion 10p of the n-type semiconductor layer 10.

However, the embodiment is not limited thereto, and, for example, the n-side electrode 70 may be provided on the second major surface 10b side of the n-type semiconductor layer 10.

GaN doped with a high concentration of Si is used, for example, for the n-side contact layer 11. The concentration of Si in the n-side cladding layer 12 is lower than in the n-side contact layer 11. GaN doped with Si or AlGaN doped with Si is used, for example, for the n-side cladding layer 12.

GaN doped with a high concentration of Mg is used, for example, for the p-side contact layer 22. The concentration of Mg in the p-side cladding layer 21 is lower than in the p-side contact layer 22. GaN doped with Mg or AlGaN doped with Mg is used, for example, for the p-side cladding layer 21.

The n-side cladding layer 12 and the p-side cladding layer 21 can be designed so as to have a waveguide function with regards to the light emitted from the well layers 31. In other words, the semiconductor light emitting device 110 can be made into a Laser Diode (LD). Additionally, the semiconductor light emitting device 110 may be an LED.

Hereinafter, a case in which the semiconductor light emitting device 110 is an LD will be described.

Figure 2A:
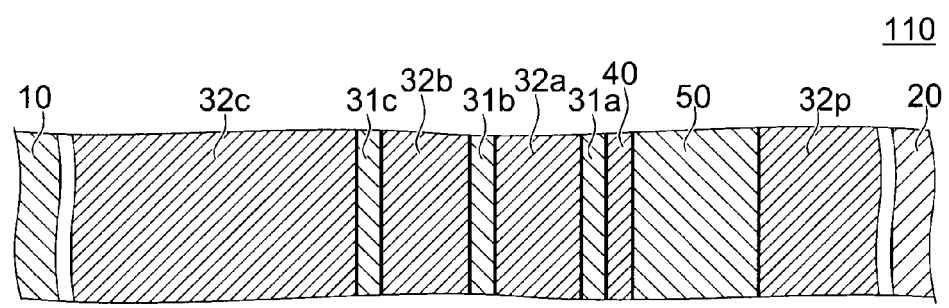
FIGS. 2A and 2B are schematic diagrams illustrating the semiconductor light emitting device according to the embodiment.
Figure 2B:
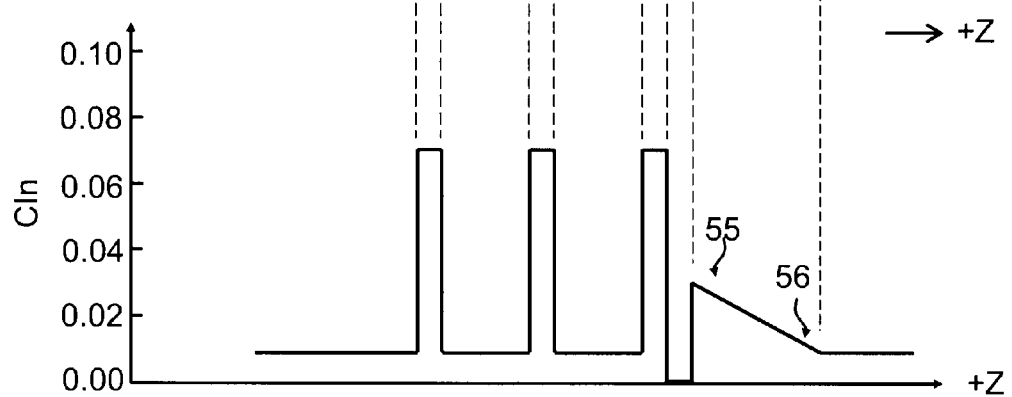

FIGS. 2A and 2B are schematic diagrams illustrating the configuration of a semiconductor light emitting device according to the embodiment.

Specifically, FIG. 2A is a schematic cross-sectional view illustrating the configuration of the semiconductor light emitting device 110 and FIG. 2B is a graph showing the In composition ratio of the semiconductor light emitting device 110. The horizontal axis in FIG. 2B represents position in the +Z-axis direction and the vertical axis represents In composition ratio CIn.

As illustrated in FIGS. 2A and 2B, the In composition ratio (the barrier layer In composition ratio b1) of the barrier layers 32 (the first to the third barrier layers 32a to 32c) is 0.01. The In composition ratio (the well layer In composition ratio w) of the well layers 31 (the first to the third well layers 31a to 31c) is 0.07.

In this example, $Al_{0.05}Ga_{0.95}N$ is used for the Al-containing layer 40. In other words, the In composition ratio of the Al-containing layer 40 is substantially 0.

InGaN is used for the intermediate layer 50, and the In composition ratio of a portion of the intermediate layer 50 on the n-type semiconductor layer 10 side (first portion 55) is 0.03, and the In composition ratio of a portion of the intermediate layer 50 on the p-type semiconductor layer 20 side (second portion 56) is 0.01.

Thus, the In composition ratio of the first portion 55 of the intermediate layer 50 is higher than 0 and lower than the In composition ratio of the well layers 31 (i.e. the first well layer 31a).

Moreover, in this example, the In composition ratio of the intermediate layer 50 decreases continuously from the portion on the n-type semiconductor layer 10 side (the first portion 55) toward the portion on the p-type semiconductor layer 20 side (the second portion 56). Thus, the In composition ratio of the intermediate layer 50 is inclined.

As discussed hereinafter, the state of variation of the In composition ratio of the intermediate layer 50 may be set as desired. The In composition ratio of the intermediate layer 50 may decrease continuously in a linear manner or in a curved manner or stepwise along the direction (with movement in the +Z-axis direction) from the Al-containing layer 40 toward the p-type semiconductor layer 20.

Thus, in the intermediate layer 50, by setting the In composition ratio of the first portion 55 on the n-type semiconductor layer 10 side to be higher than the In composition ratio of the second portion 56 on the p-type semiconductor layer 20 side, a band gap energy of the first portion 55 is set to be smaller than a band gap energy of the second portion 56.

Thus, the intermediate layer 50 includes the first portion 55 and the second portion 56 provided between the first portion 55 and the p-type semiconductor layer 20. The band gap energy of the first portion 55 is smaller than the band gap energy of the second portion 56.

As illustrated in FIG. 2A, in this example, a p-side barrier layer 32p is provided between the intermediate layer 50 and the p-type semiconductor layer 20. InGaN is used for the p-side barrier layer 32p, and the In composition ratio of the p-side barrier layer 32p is set to 0.01. In other words, the same material used for the first to the third barrier layers 32a to 32c is used for the p-side barrier layer 32p.

FIGS. 3A to 3D are schematic diagrams illustrating band gap energies in semiconductor light emitting devices.

Figure 3A:
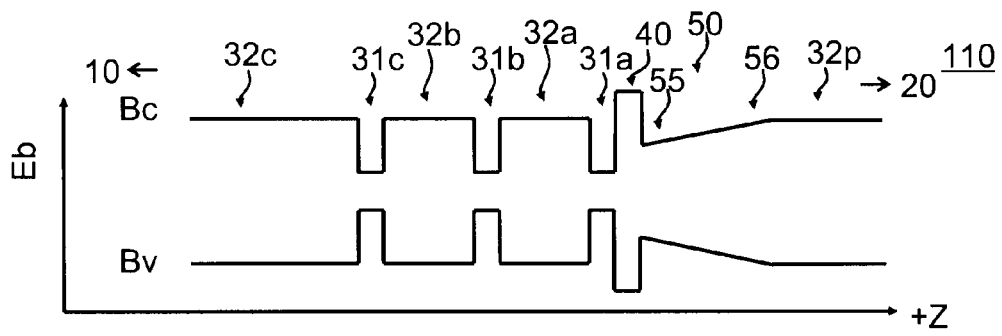
FIGS. 3A to 3D are schematic diagrams illustrating band gap energies in semiconductor light emitting devices.
Figure 3B:
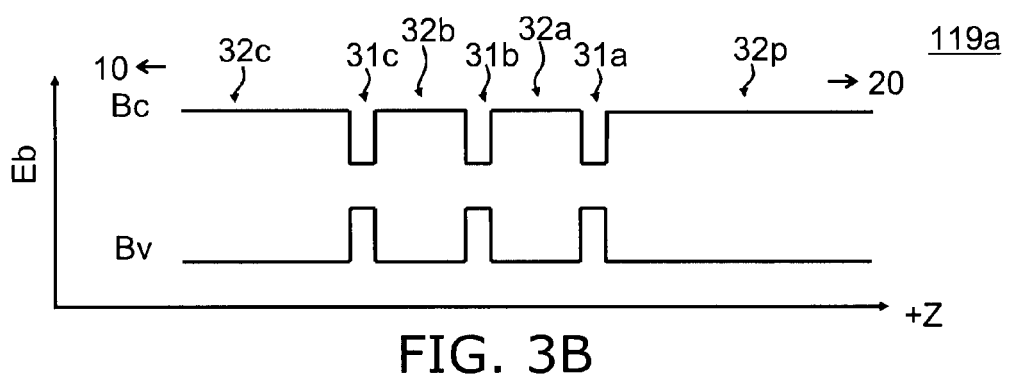
Figure 3C:
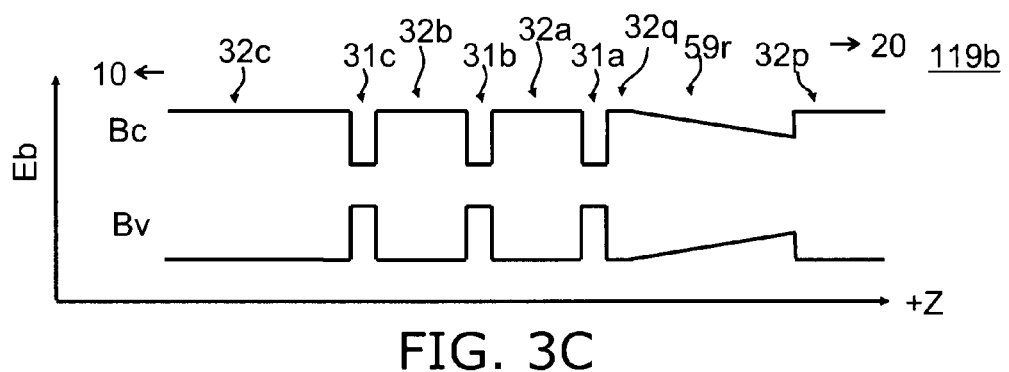
Figure 3D:
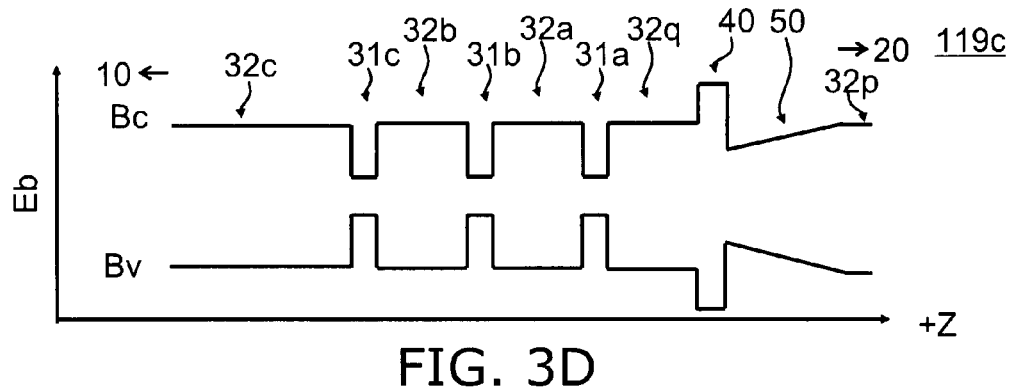

Specifically, FIG. 3A corresponds to the semiconductor light emitting device 110 according to the embodiment, and FIGS. 3B to 3D correspond to semiconductor light emitting devices 119a to 119c of the first to the third reference examples. In these drawings, the horizontal axis represents position in the +Z-axis direction, and the vertical axis represents a band gap energy Eb. Energy of a conduction band Bc and energy of a valence band Bv are shown schematically in these drawings.

As illustrated in FIG. 3A, in the semiconductor light emitting device 110 according to this embodiment, the band gap energies of the first to the third well layers 31a to 31c are smaller than the band gap energies of the first to the third barrier layers 32a to 32c.

The band gap energy of the Al-containing layer 40 in contact with the first well layer 31a, which is the closest to the p-type semiconductor layer 20 among the well layers 31, is set to be larger than the band gap energy of the first to the third barrier layers 32a to 32c.

The band gap energy of the first portion 55 on the n-type semiconductor layer 10 side of the intermediate layer 50 is smaller than the band gap energy of the second portion 56 on the p-type semiconductor layer 20 side of the intermediate layer 50.

In this example, the band gap energy of the p-side barrier layer 32p is the same as the band gap energy of the first to the third barrier layers 32a to 32c.

In this example, the band gap energy of the intermediate layer 50 increases continuously in a linear manner along the +Z-axis direction.

However, as previously described, the state of variation of the In composition ratio of the intermediate layer 50 may be set as desired, and the band gap energy of the intermediate layer 50 may increase continuously in a curved manner along the +Z-axis direction. The band gap energy of the intermediate layer 50 may also increase stepwise along the +Z-axis direction.

The band gap energy of the first portion 55 of the intermediate layer 50 (the portion on the n-type semiconductor layer 10 side) is smaller than the band gap energy of the first to the third barrier layers 32a to 32c. Furthermore, the band gap energy of the first portion 55 is smaller than the band gap energy of the p-type semiconductor layer 20 (omitted in FIG. 3A).

The band gap energy of the second portion 56 of the intermediate layer 50 (the portion on the p-type semiconductor layer 20 side) is smaller than or equal to the band gap energy of the p-type semiconductor layer 20 (omitted in FIG. 3A).

As illustrated in FIG. 3B, in the semiconductor light emitting device 119a of the first reference example, the Al-containing layer 40 and the intermediate layer 50 are not provided. In other words, the p-side barrier layer 32p is provided in contact with the first well layer 31a.

As illustrated in FIG. 3C, in the semiconductor light emitting device 119b of the second reference example, an intermediate barrier layer 32q is provided in contact with a face of the p-type semiconductor layer 20 side of the first well layer 31a, and a reverse inclined layer 59r is provided in contact with a face of the p-type semiconductor layer 20 side of the intermediate barrier layer 32q. A band gap energy of a portion on the n-type semiconductor layer 10 side of the reverse inclined layer 59r is larger than a band gap energy of a portion on the p-type semiconductor layer 20 side of the reverse inclined layer 59r. In other words, an incline direction of the band gap energy of the reverse inclined layer 59r is the opposite of a direction of an incline direction of the band gap energy of the intermediate layer 50 of the semiconductor light emitting device 110. Moreover, the p-side barrier layer 32p is provided on the p-type semiconductor layer 20 side of the reverse inclined layer 59r.

As illustrated in FIG. 3D, in the semiconductor light emitting device 119c of the third reference example, the intermediate barrier layer 32$q$ is provided in contact with a face of the p-type semiconductor layer 20 side of the first well layer 31$a$. The Al-containing layer 40 is provided in contact with a face of the p-type semiconductor layer 20 side of the intermediate barrier layer 32$q$. The intermediate layer 50 is provided in contact with a face of the p-type semiconductor layer 20 side of the Al-containing layer 40. Furthermore, the p-side barrier layer 32$p$ is provided in contact with a face of the p-type semiconductor layer 20 side of the intermediate layer 50. In other words, the configuration of the semiconductor light emitting device 119$c$ of the third reference example corresponds with the configuration in which the intermediate barrier layer 32$q$ is provided between the Al-containing layer 40 and the first well layer 31$a$ in the semiconductor light emitting device 110 according to this embodiment.

Hereinafter, results of simulations of the characteristics of the semiconductor light emitting devices 110 and 119$a$ to 119$c$ that have the configurations will be described.

Figure 4A:
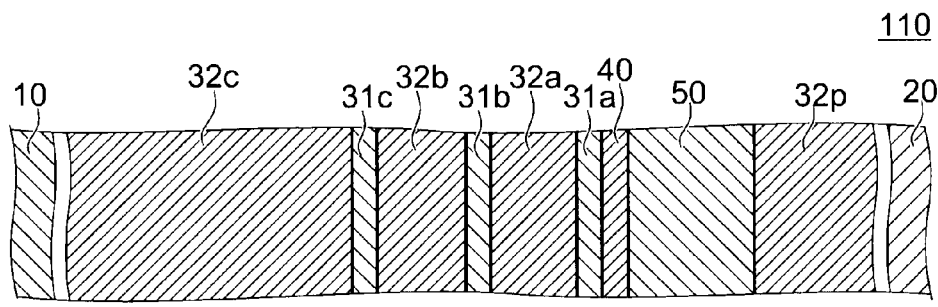
FIGS. 4A to 4C are schematic diagrams illustrating the configuration and characteristics of the semiconductor light emitting device according to the embodiment.
Figure 4B:
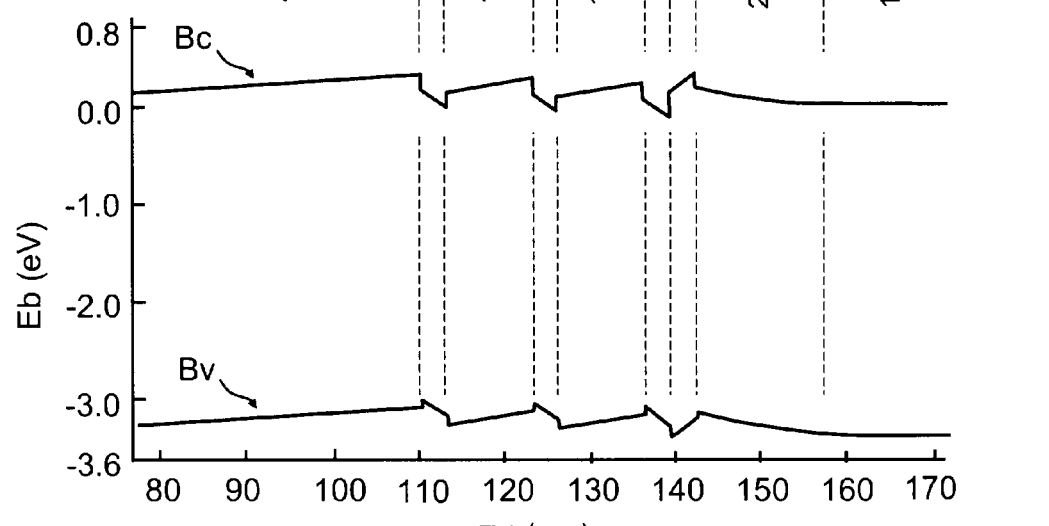
Figure 4C:
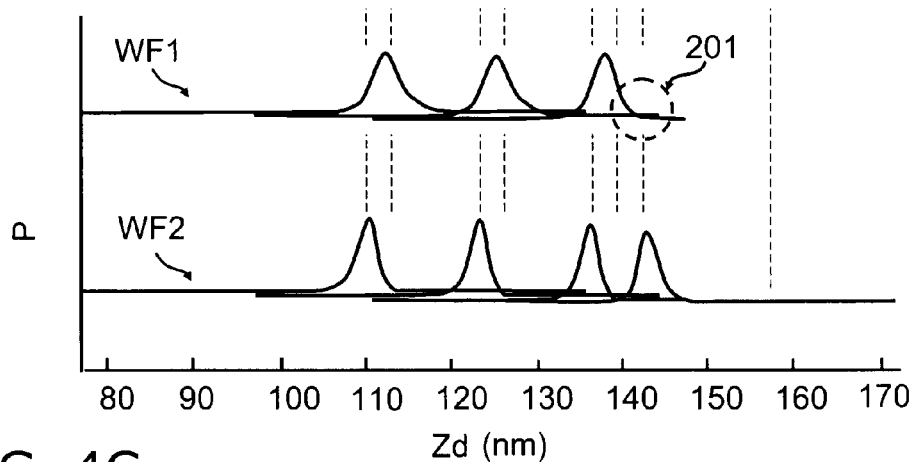

FIGS. 4A to 4C are schematic diagrams illustrating the configuration and characteristics of the semiconductor light emitting device according to the embodiment.

FIG. 4A is a schematic cross-sectional view illustrating the configuration of the semiconductor light emitting device 110. FIG. 4B is a schematic diagram illustrating the simulation results of the band gap energy. FIG. 4C is a schematic diagram illustrating the simulation results of an electron wave function WF1 and a hole wave function WF2. In the hole wave function WF2, a light hole wave function and a heavy hole wave function were simulated, but since both were substantially consistent, the simulation results are represented by a single line. The horizontal axis in FIGS. 4B and 4C represent a position ZD along the +Z-axis direction.

As illustrated in FIG. 4A, in this simulation, a thickness of the third barrier layer 32$c$ was 40 nm, and thicknesses of the first barrier layer 32$a$ and the second barrier layer 32$b$ were 10 nm. The thicknesses of the first to the third well layers 31$a$ to 31$c$ were 3 nm. A thickness of the Al-containing layer 40 was 3 nm. A thickness of the intermediate layer 50 was 20 nm. A thickness of the p-side barrier layer 32$p$ was 17 nm.

$In_{0.07}Ga_{0.93}N$ was used for the first to the third well layers 31$a$ to 31$c$. $In_{0.01}Ga_{0.99}N$ was used for the first to the third barrier layers 32$a$ to 32$c$ and the p-side barrier layer 32$p$. $Al_{0.05}Ga_{0.95}N$ was used for the Al-containing layer 40. InGaN was used for the intermediate layer 50, $In_{0.03}Ga_{0.97}N$ was used for the portion (the first portion 55) on the n-type semiconductor layer 10 side, and $In_{0.01}Ga_{0.99}N$ was used for the portion (the second portion 56) on the p-type semiconductor layer 20 side. The In composition ratio of the intermediate layer 50 was made to vary in a linear manner.

As illustrated in FIG. 4B, in the simulation results, a high barrier to electrons and holes is formed in a vicinity of an interface between the first well layer 31$a$ and the Al-containing layer 40.

As illustrated in FIG. 4C, in the electron wave function WF1 on the p-type semiconductor layer 20 side, a tail portion 201 is small. Electrons are efficiently confined in the interface between the first well layer 31$a$ and the Al-containing layer 40. In other words, in the semiconductor light emitting device 110, the electrons in the first well layer 31$a$ are more localized.

Four peaks are shown in the hole wave function WF2. Specifically, three peaks that respectively correspond to the first to the third well layers 31$a$ to 31$c$, and a fourth peak that corresponds to a portion in the vicinity of the interface between the Al-containing layer 40 and the intermediate layer 50 are shown. The appearance of this fourth peak corresponds to holes being efficiently injected into the vicinity of the interface between the Al-containing layer 40 and the intermediate layer 50. In other words, in the semiconductor light emitting device 110, injection efficiency of holes into the Multiple Quantum Wells (MQW including the first to the third well layers 31$a$ to 31$c$) is high.

Figure 5A:
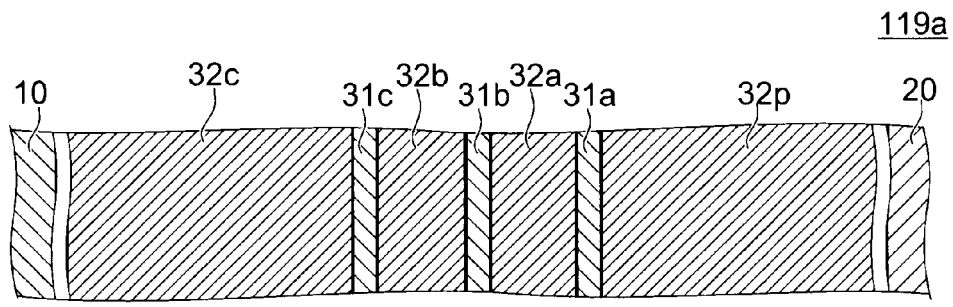
FIGS. 5A to 5C are schematic diagrams illustrating the configuration and characteristics of the semiconductor light emitting device of a first reference example.
Figure 5B:
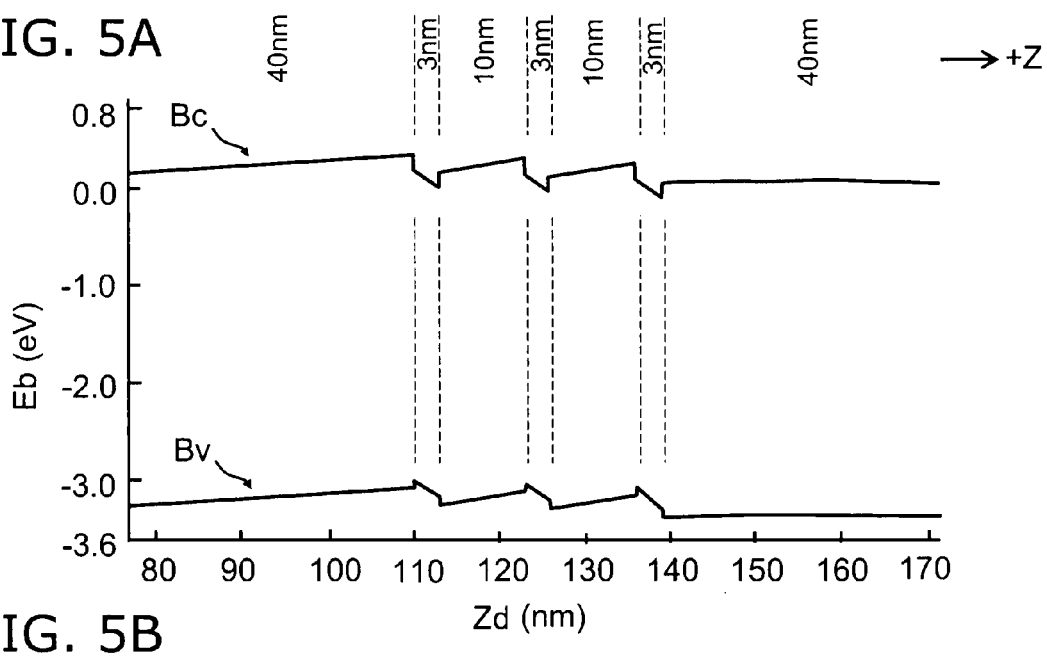
Figure 5C:
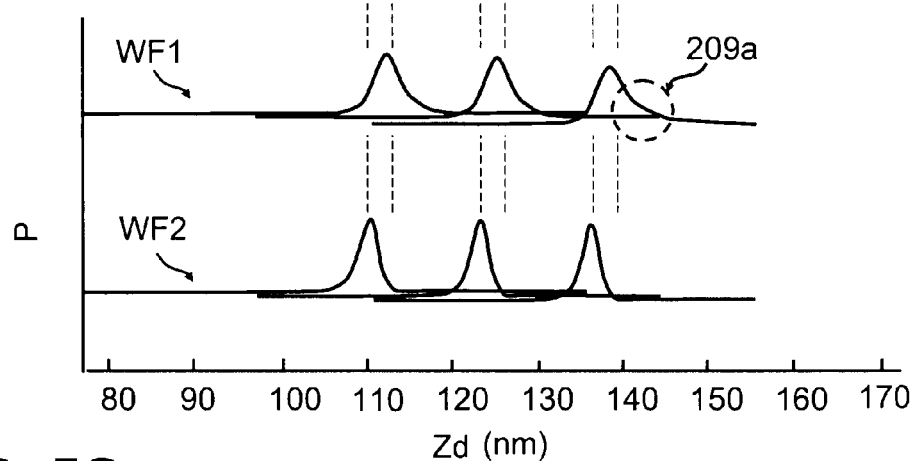

FIGS. 5A to 5C are schematic diagrams illustrating the configuration and characteristics of the semiconductor light emitting device of the first reference example.

As illustrated in FIG. 5A, in the semiconductor light emitting device 119$a$, the Al-containing layer 40 and the intermediate layer 50 were not provided, and the thickness of the p-side barrier layer 32$p$ was 40 nm. The material of the p-side barrier layer 32$p$ was set to be the same as in the semiconductor light emitting device 110. The thicknesses and materials of the first to the third well layers 31$a$ to 31$c$ and the first to the third barrier layers 32$a$ to 32$c$ were set to be the same as in the semiconductor light emitting device 110.

As illustrated in FIG. 5B, in the simulation results, a barrier to the first well layer 31$a$ has smaller energy on the p-side barrier layer 32$p$ side.

As illustrated in FIG. 5C, in the electron wave function WF1 on the p-type semiconductor layer 20 side, a tail portion 209$a$ is large. In other words, in the semiconductor light emitting device 119$a$, the electrons in the first well layer 31$a$ are not sufficiently confined in the first well layer 31$a$.

Figure 6A:
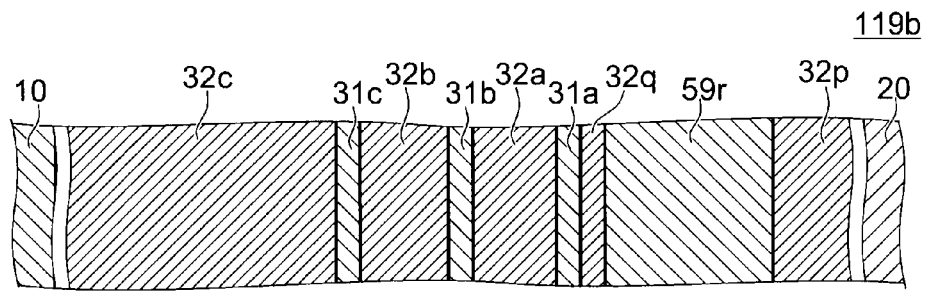
FIGS. 6A to 6C are schematic diagrams illustrating the configuration and characteristics of the semiconductor light emitting device of a second reference example.
Figure 6B:
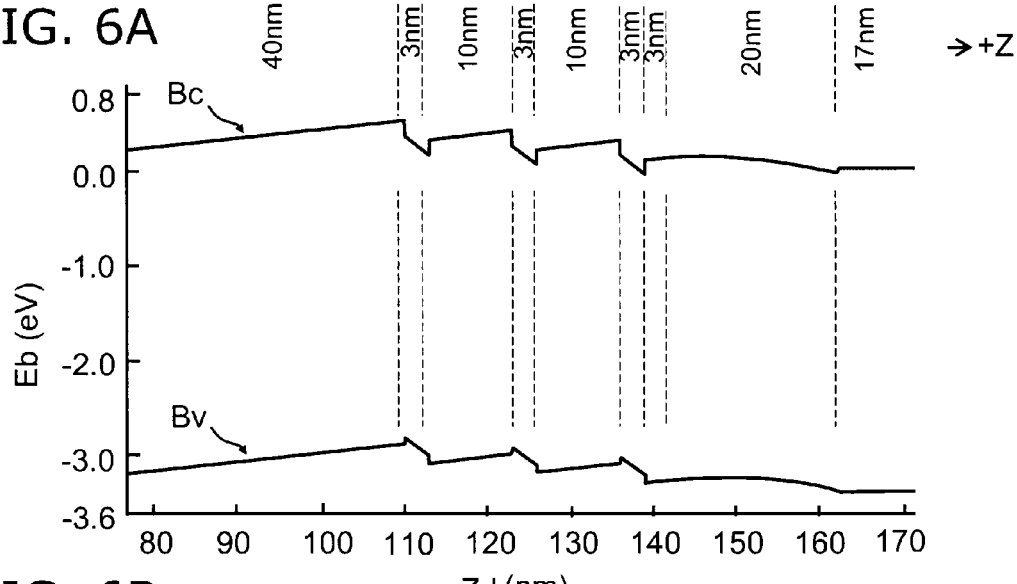
Figure 6C:
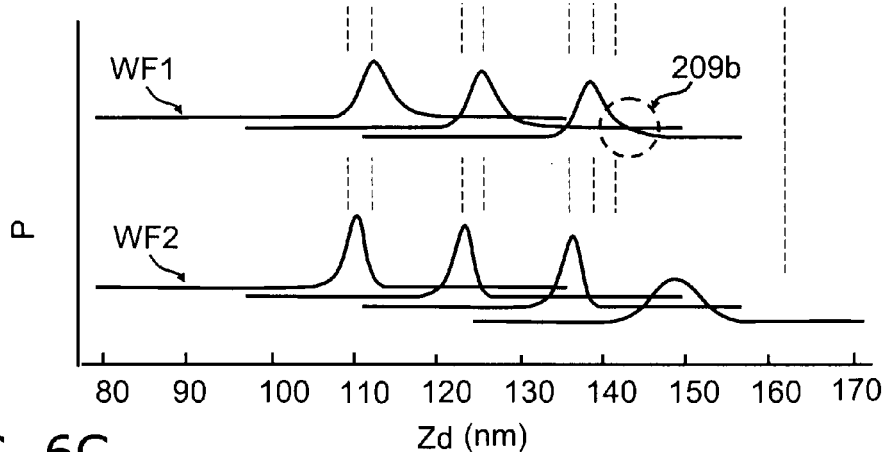

FIGS. 6A to 6C are schematic diagrams illustrating the configuration and characteristics of the semiconductor light emitting device of the second reference example.

As illustrated in FIG. 6A, in the semiconductor light emitting device 119$b$, a thickness of the intermediate barrier layer 32$q$ was 3 nm, the thickness of the reverse inclined layer 59$r$ was 20 nm, and the thickness of the p-side barrier layer 32$p$ was 17 nm. The reverse inclined layer 59$r$ and the intermediate barrier layer 32$q$ can be considered as a single layer. In this case, it is considered that, in a portion of the first well layer 31$a$ side of that single layer where the thickness is 3 nm, the band gap energy is constant, and in a remaining portion where the thickness is 20 nm, the band gap energy decreases along the +Z-axis direction.

InGaN was used for the reverse inclined layer 59$r$, and the In composition ratio of a portion on the n-type semiconductor layer 10 side of the reverse inclined layer 59$r$ was set to be lower than the In composition ratio of a portion on the p-type semiconductor layer 20 side of the reverse inclined layer 59$r$. Compositions of the intermediate barrier layer 32$q$ and the p-side barrier layer 32$p$ were the same as of the first to the third barrier layers 32$a$ to 32$c$.

The thicknesses and materials of the first to the third well layers 31$a$ to 31$c$ and the first to the third barrier layers 32$a$ to 32$c$ were set to be the same as in the semiconductor light emitting device 110.

Thus, the configuration of the semiconductor light emitting device 119$b$ corresponds to the configuration in which the intermediate barrier layer 32$q$ having the same composition as the other barrier layers 32 is disposed in lieu of the Al-containing layer 40 of the semiconductor light emitting device 110, and a reverse inclined layer 59$r$ having an In composition ratio of a reversed direction is disposed in lieu of the intermediate layer 50 of the semiconductor light emitting device 110.

As illustrated in FIG. 6B, a barrier at an interface between the first well layer 31$a$ and the intermediate barrier layer 32$q$ is small. Thus, in the semiconductor light emitting device 119$b$, the intermediate barrier layer 32$q$, the reverse inclined layer 59$r$, and the p-side barrier layer 32$p$ are provided on the p-type semiconductor layer 20 side of the first well layer 31$a$, but it is considered that the characteristics of confining the electrons is less than or equal to that of the semiconductor light emitting device 119a.

As illustrated in FIG. 6C, even in the semiconductor light emitting device 119b, a tail portion 209b of the electron wave function WF1 on the p-type semiconductor layer 20 side is large. In other words, the electrons in the first well layer 31a are not sufficiently confined in the first well layer 31a.

Four peaks are shown in the hole wave function WF2. The hole wave function WF2 on the p-type semiconductor layer 20 side is located substantially in a center portion in a thickness direction of the reverse inclined layer 59r, and the holes exist in a position distant from the first well layer 31a. As a result, in the semiconductor light emitting device 119b, it is considered that injection efficiency of the holes into the MQW is low.

Figure 7A:
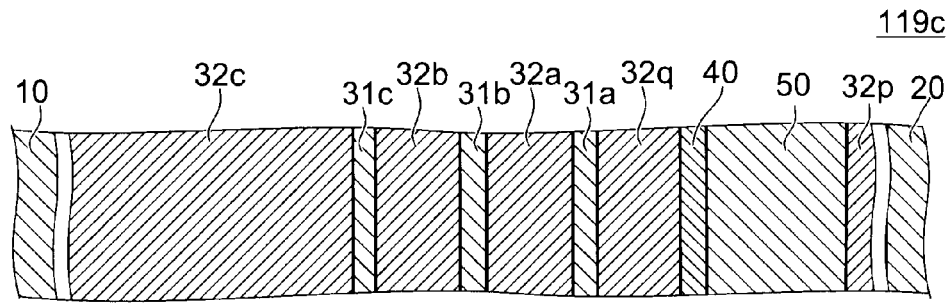
FIGS. 7A to 7C are schematic diagrams illustrating the configuration and characteristics of the semiconductor light emitting device of a third reference example.
Figure 7B:
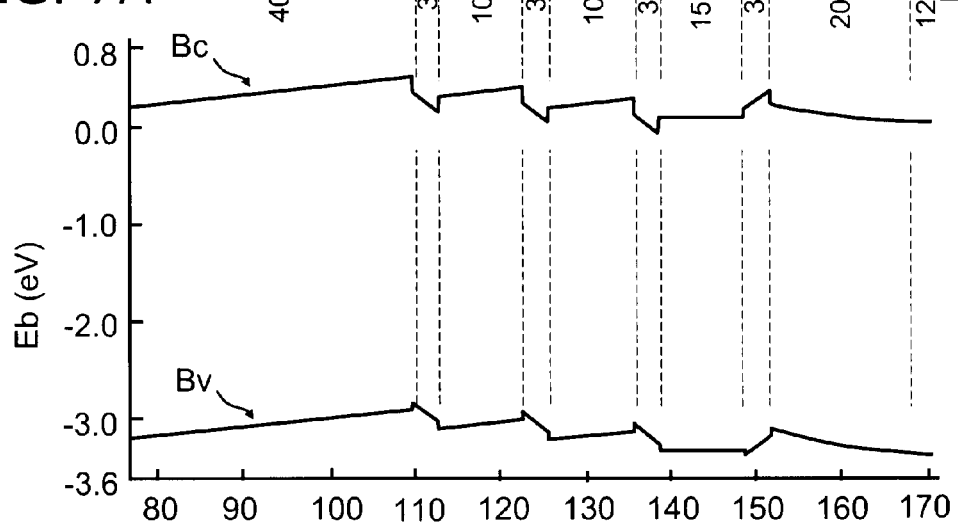
Figure 7C:
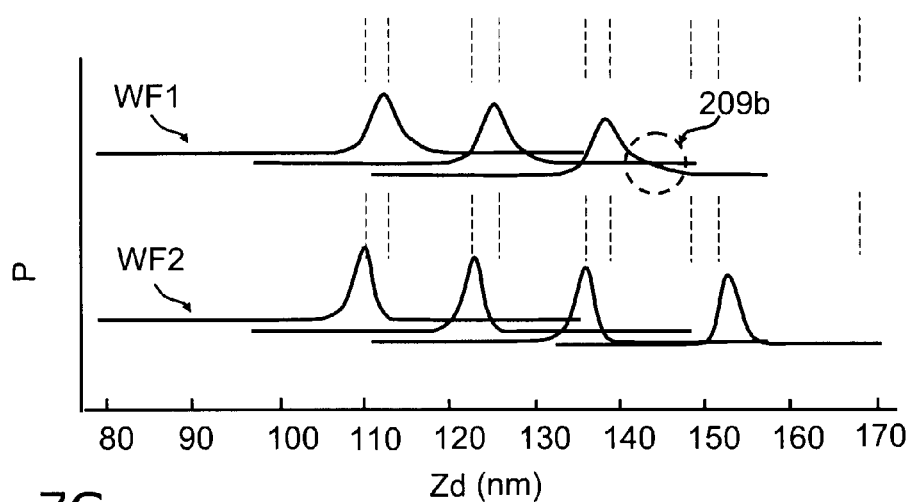

FIGS. 7A to 7C are schematic diagrams illustrating the configuration and characteristics of the semiconductor light emitting device of the third reference example.

As illustrated in FIG. 7A, in the semiconductor light emitting device 119c, the thickness of the intermediate barrier layer 32q was 15 nm and the thickness of the p-side barrier layer 32p was 12 nm. Material used for the p-side barrier layer 32p was the same as that used for the first to the third barrier layers 32a to 32c. Material used for the intermediate barrier layer 32q was $In_{0.011}Ga_{0.989}N$.

The thicknesses and materials of the first to the third well layers 31a to 31c, the first to the third barrier layers 32a to 32c, the Al-containing layer 40, and the intermediate layer 50 were set to be the same as in the semiconductor light emitting device 110.

As illustrated in FIG. 7B, in the semiconductor light emitting device 119c, a barrier based on the Al-containing layer 40 exists at a position distant from the first well layer 31a. This is due to the intermediate barrier layer 32q being provided between the Al-containing layer 40 and the first well layer 31a. In the semiconductor light emitting device 119c, it is considered that the characteristics of confining the electrons is less than or equal to that of the semiconductor light emitting device 119a.

As illustrated in FIG. 7C, even in the semiconductor light emitting device 119c, a tail portion 209b of the electron wave function WF1 on the p-type semiconductor layer 20 side is large. In other words, the electrons in the first well layer 31a are not sufficiently confined in the first well layer 31a.

Four peaks are shown in the hole wave function WF2. The hole wave function WF2 on the p-type semiconductor layer 20 side is located in a vicinity of the interface between the Al-containing layer 40 and the intermediate layer 50, and the holes exist in a position distant from the first well layer 31a. As a result, in the semiconductor light emitting device 119c, it is considered that injection efficiency of the holes into the MQW is low.

Figure 8A:
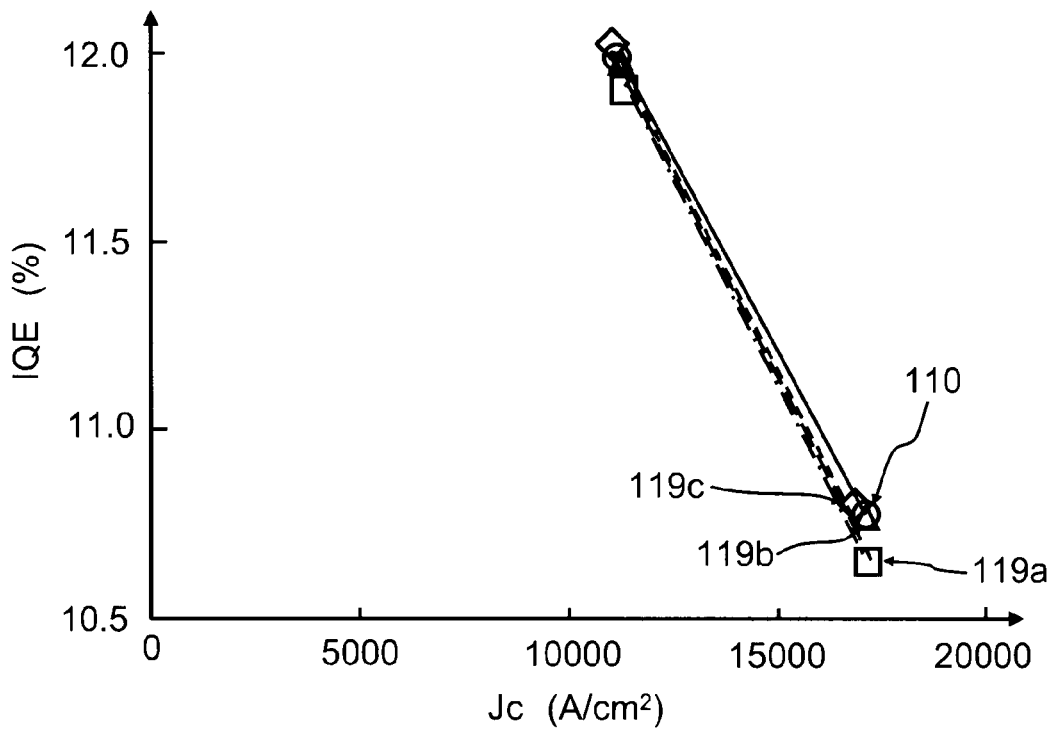
FIGS. 8A and 8B are graphs illustrating the characteristics of semiconductor light emitting devices.
Figure 8B:
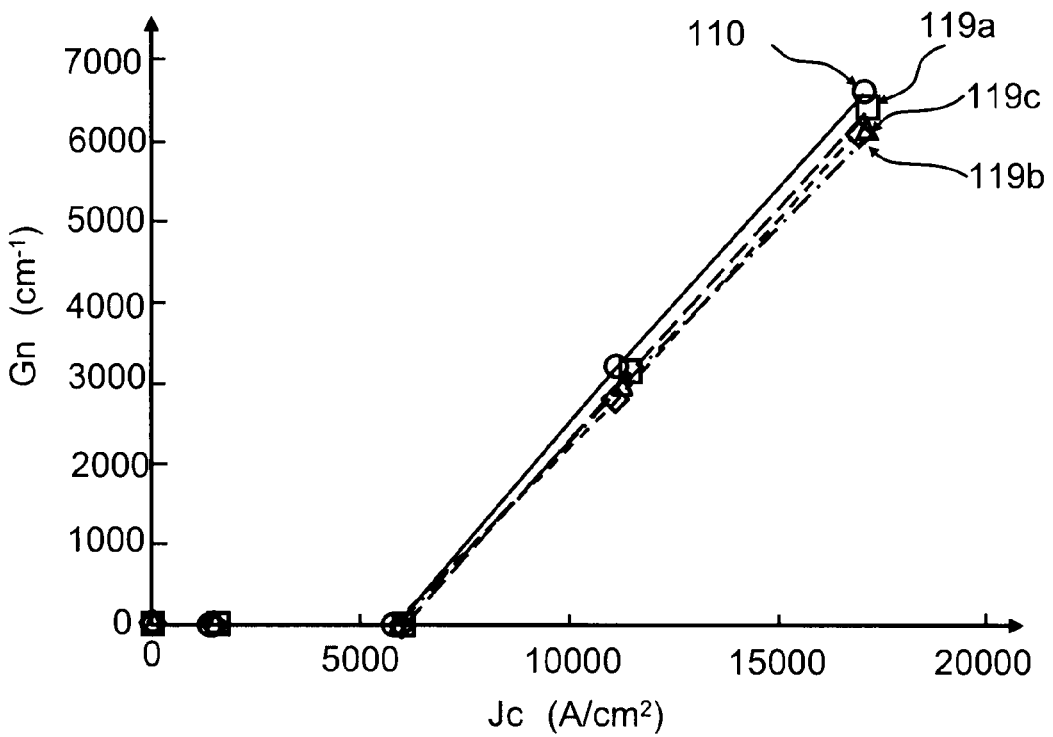

FIGS. 8A and 8B are graphs illustrating the characteristics of semiconductor light emitting devices.

Specifically, these graphs show the characteristics of the semiconductor light emitting device 110 and the semiconductor light emitting devices 119a to 119c. Current density Jc is shown on the horizontal axis of these graphs. Internal quantum efficiency IQE is shown on the vertical axis of FIG. 8A. In FIG. 8A, characteristics of regions where the current density is low are omitted. Gain Gn is shown on the vertical axis of FIG. 8B.

As illustrated in FIG. 8A, in the semiconductor light emitting device 110 according to this embodiment, compared to the semiconductor light emitting devices 119a to 119c of the first to the third reference examples, a high internal quantum efficiency IQE is obtained.

As illustrated in FIG. 8B, in the semiconductor light emitting device 110 according to this embodiment, compared to the semiconductor light emitting devices 119a to 119c of the first to the third reference examples, a high gain Gn is obtained.

Figure 9A:
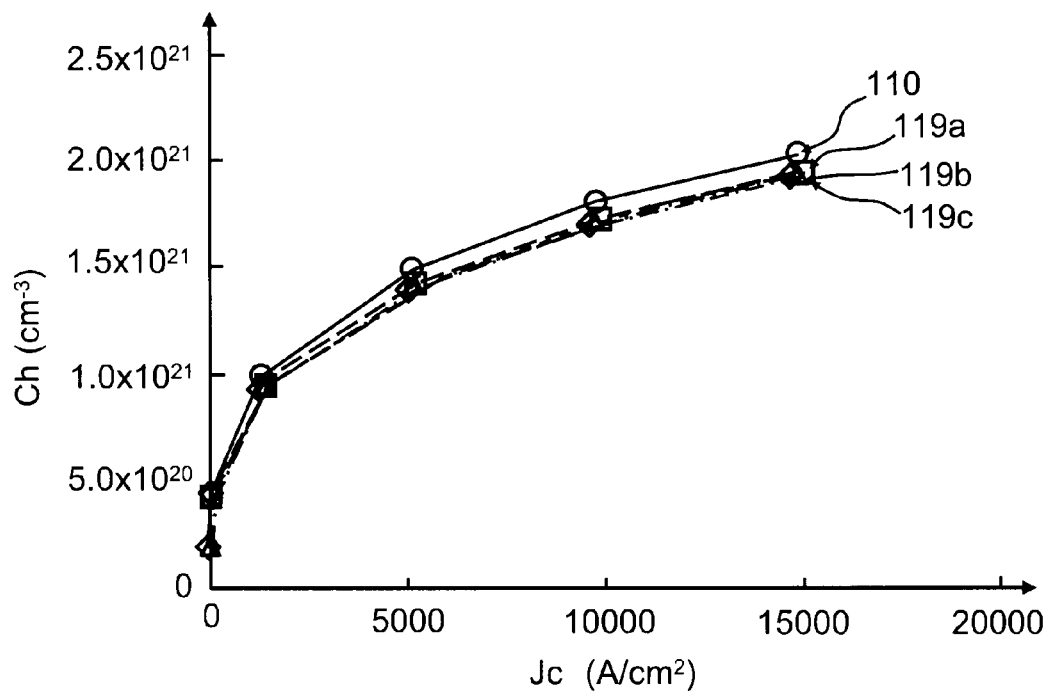
FIGS. 9A and 9B are graphs illustrating the characteristics of semiconductor light emitting devices.
Figure 9B:
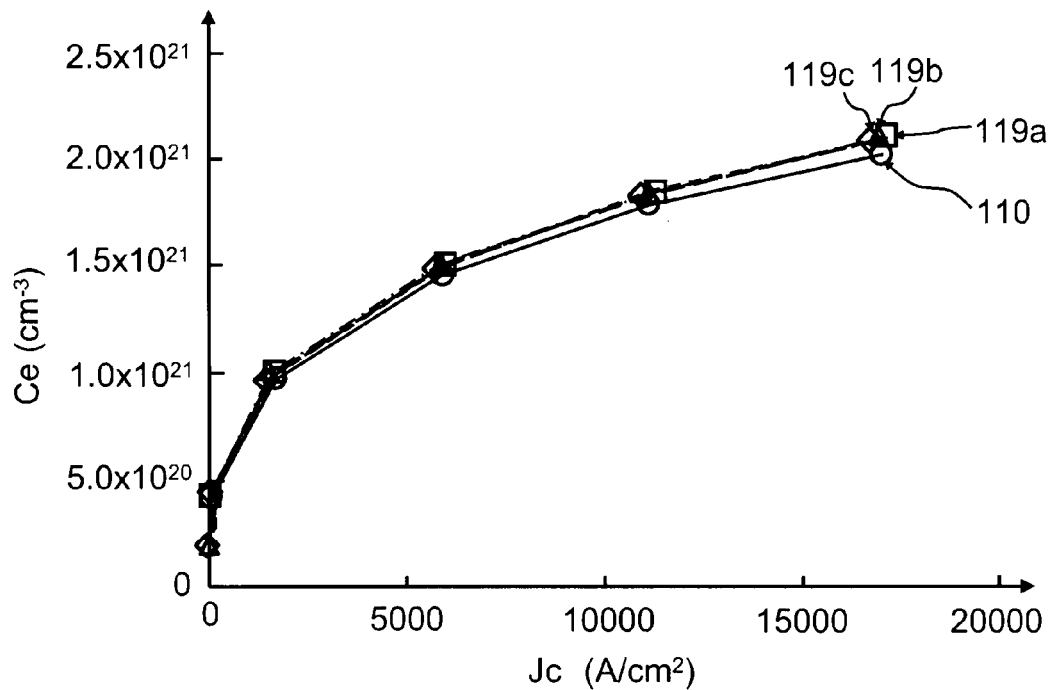

FIGS. 9A and 9B are graphs illustrating the characteristics of semiconductor light emitting devices.

Specifically, these graphs show the characteristics of the carrier concentration (hole concentration and electron concentration) of the semiconductor light emitting device 110 and the semiconductor light emitting devices 119a to 119c. Current density Jc is shown on the horizontal axis of these graphs. Hole concentration Ch is shown on the vertical axis of FIG. 9A. Electron concentration Ce is shown on the vertical axis of FIG. 9B.

As illustrated in FIGS. 9A and 9B, in the semiconductor light emitting devices 119a, 119b, and 119c of the first, second, and third reference examples, compared to the electron concentration Ce, the hole concentration Ch is considerably high.

In the semiconductor light emitting device 110 according to this embodiment, the hole concentration Ch is substantially concurrent with the electron concentration Ce. Thus, in the semiconductor light emitting device 110, the balance of the carrier density is good.

As described above, in the semiconductor light emitting device 110, balance between the hole concentration Ch and the electron concentration Ce can be improved more than in the semiconductor light emitting devices 119a, 119b, and 119c of the first, second, and third reference examples, and this is thought to be factor leading to high luminous efficiency.

Figure 10:
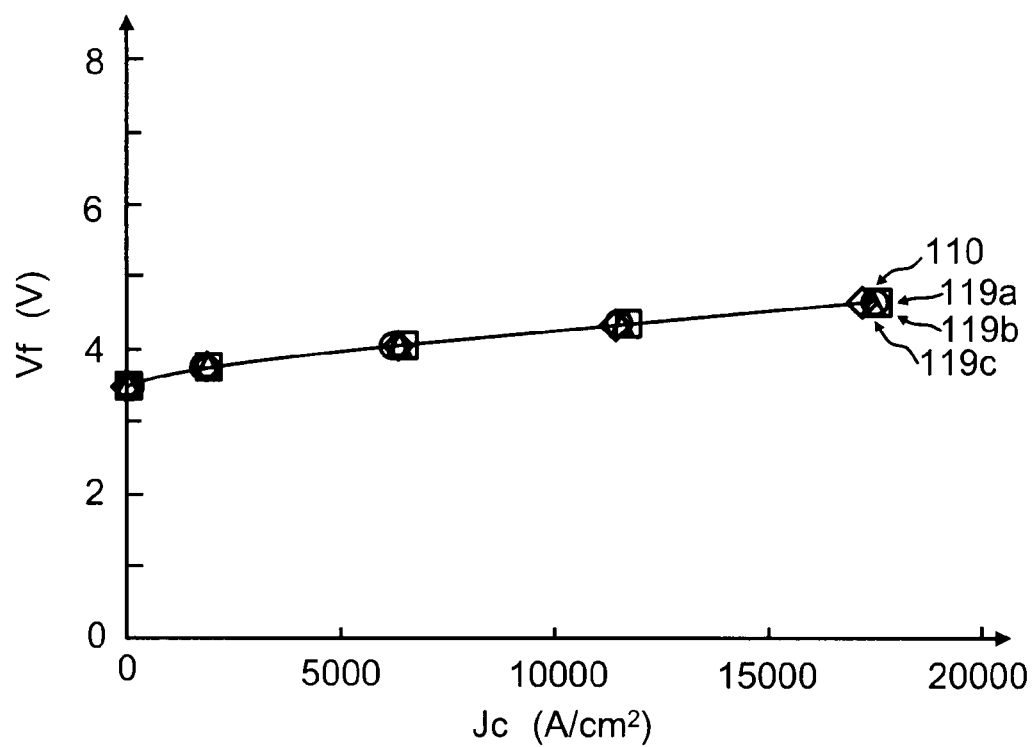
FIG. 10 is a graph illustrating the characteristics of semiconductor light emitting devices.

FIG. 10 is a graph illustrating the characteristics of semiconductor light emitting devices.

This graph shows operating voltages of the semiconductor light emitting device 110 and the semiconductor light emitting devices 119a to 119c. Current density JC is shown on the horizontal axis and operating voltage Vf is shown on the vertical axis.

As illustrated in FIG. 10, in the semiconductor light emitting device 110 and the semiconductor light emitting devices 119a to 119c, operating voltages Vf are substantially constant.

Thus, in the semiconductor light emitting device 110, an internal quantum efficiency IQE and gain Gn that are higher than with the semiconductor light emitting devices 119a to 119c can be realized while having an operating voltage Vf equivalent to that of the semiconductor light emitting devices 119a to 119c of the first to the third reference examples.

In the semiconductor light emitting device 110 according to this embodiment, high luminous efficiency is realized by appropriately setting the incline direction (increase/decrease) of the band gap energy of the intermediate layer 50.

Hereinafter, simulation results regarding the characteristics when the incline direction of the band gap energy is varied in a configuration in which the Al-containing layer 40 is not provided will be described as a case where the impact of the incline direction of the band gap energy on luminous efficiency is clearer.

Figure 11A:
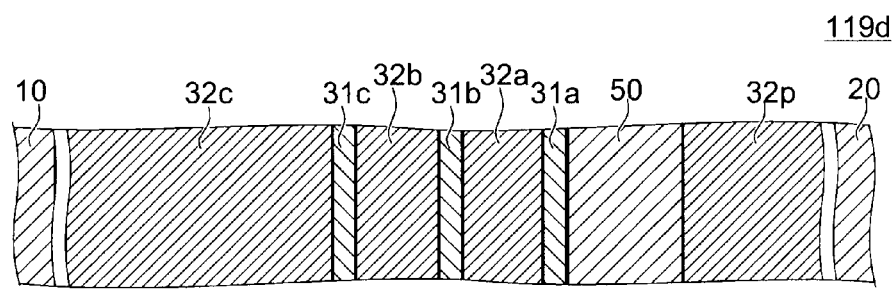
FIGS. 11A to 11C are schematic diagrams illustrating a configuration of a semiconductor light emitting device of a fourth reference example.
Figure 11B:
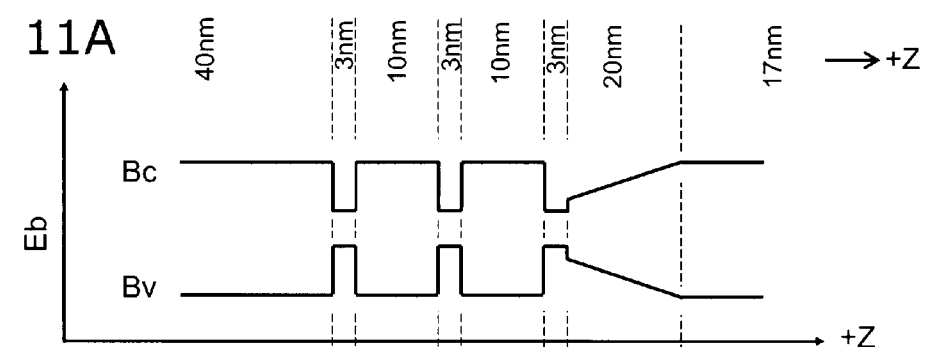
Figure 11C:
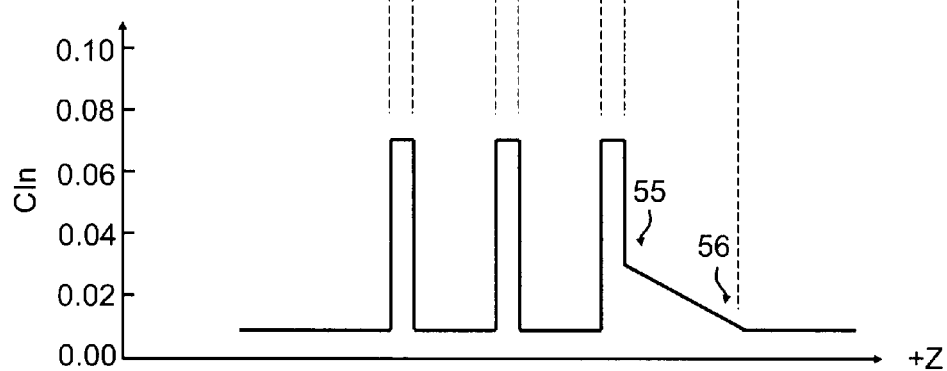

FIGS. 11A to 11C are schematic diagrams illustrating a configuration of a semiconductor light emitting device of a fourth reference example.

FIG. 11A is a schematic cross-sectional view illustrating the configuration of the semiconductor light emitting device 119d of the fourth reference example. FIG. 11B is a schematic diagram illustrating band gap energy. FIG. 11C shows an In composition ratio.

As illustrated in FIG. 11A, in the semiconductor light emitting device 119d, the Al-containing layer 40 is not provided, and the intermediate layer 50 is provided in contact with a face of the p-type semiconductor layer 20 side of the first well layer 31a. As illustrated in FIG. 11C, an In composition ratio of the intermediate layer 50 decreases in the +Z-axis direction. As illustrated in FIG. 11B, the band gap energy of the intermediate layer 50 increases in the +Z-axis direction.

Figure 12A:
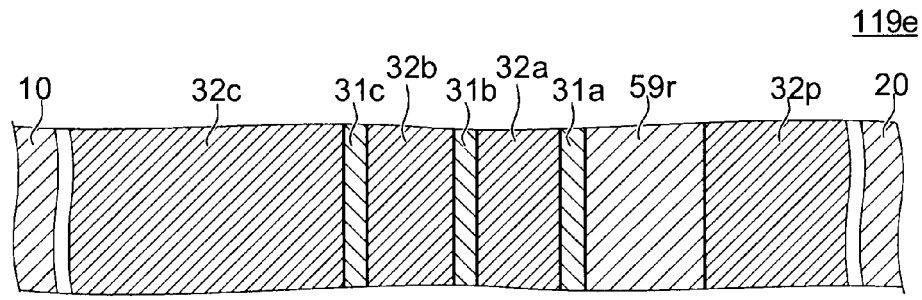
FIGS. 12A to 12C are schematic diagrams illustrating a configuration of a semiconductor light emitting device of a fifth reference example.
Figure 12B:
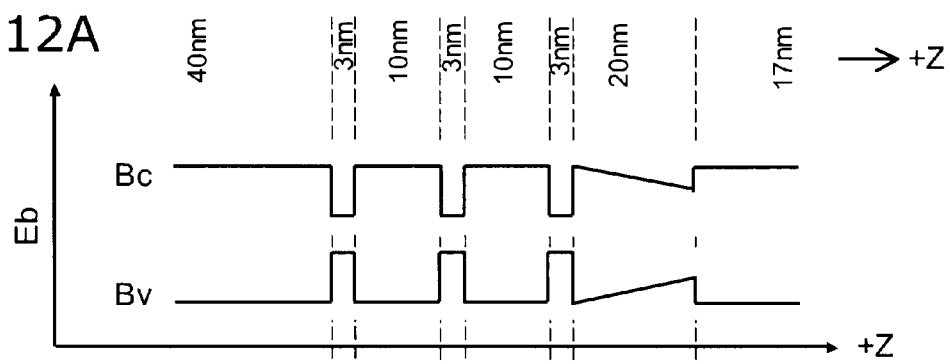
Figure 12C:
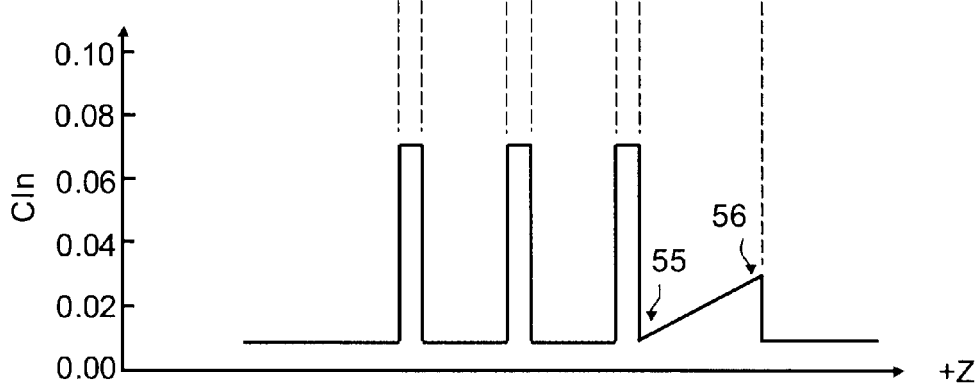

FIGS. 12A to 12C are schematic diagrams illustrating a configuration of a semiconductor light emitting device of a fifth reference example.

As illustrated in FIG. 12A, in the semiconductor light emitting device 119e of the fifth reference example, the Al-containing layer 40 is not provided, and the reverse inclined layer 59r is provided in contact with a face of the p-type semiconductor layer 20 side of the first well layer 31a. As illustrated in FIG. 12C, an In composition ratio of the reverse inclined layer 59r increases in the +Z-axis direction. As illustrated in FIG. 12B, the band gap energy of the reverse inclined layer 59r decreases in the +Z-axis direction.

Figure 13:
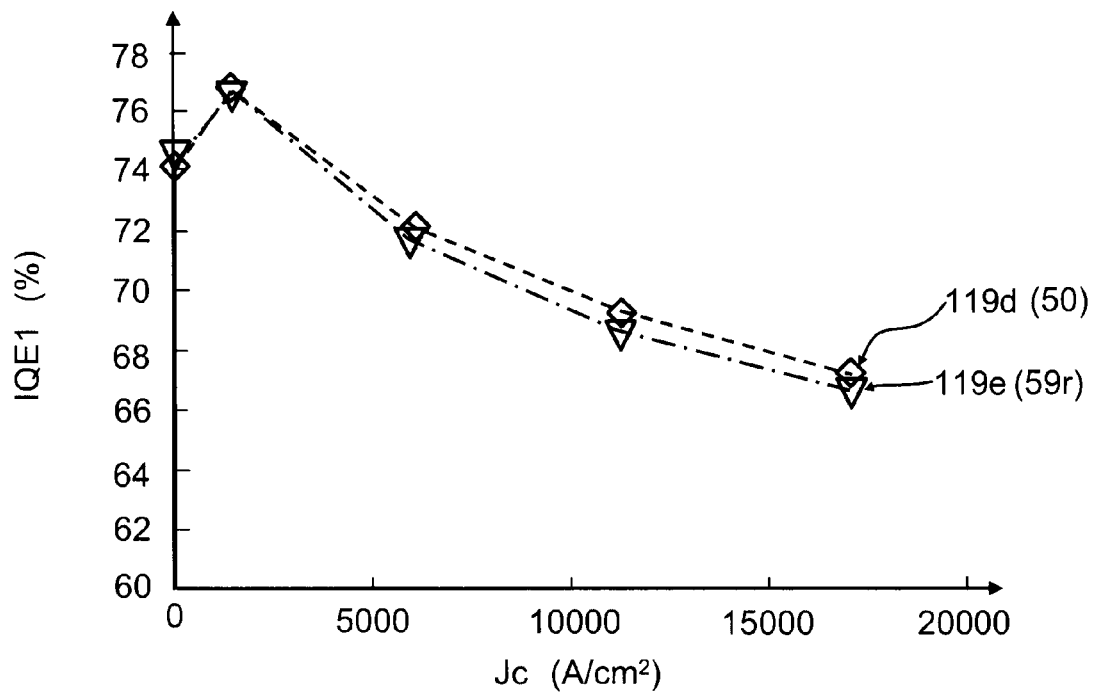
FIG. 13 is a graph illustrating the characteristics of the semiconductor light emitting devices of the fourth and fifth reference examples.

FIG. 13 is a graph illustrating the characteristics of the semiconductor light emitting devices of the fourth and fifth reference examples.

In this graph, current density JC is shown on the horizontal axis, and internal quantum efficiency IQE1 of the first well layer 31a is shown on the vertical axis. The internal quantum efficiency IQE in the previously described FIG. 8A corresponds to a general internal quantum efficiency including the first to the third well layers 31a to 31c. On the other hand, the internal quantum efficiency IQE1 in FIG. 13 is an internal quantum efficiency of only the first well layer 31a.

As illustrated in FIG. 13, in the semiconductor light emitting devices 119d and 119e in which the incline directions of the band gap energies are mutually reversed, the internal quantum efficiencies IQE mutually differ.

Thus, the incline direction of the band gap energy affects luminous efficiency. Therefore, in order to obtain high luminous efficiency, it is necessary to appropriately set the incline direction of the band gap energy.

As described with respect to FIG. 4, in the semiconductor light emitting device 110 according to this embodiment, the Al-containing layer 40 is provided in contact with the face of the p-type semiconductor layer 20 side of the first well layer 31a; and the intermediate layer 50, having a band gap energy that increases along the +Z-axis direction, is provided in contact with the face of the p-type semiconductor layer 20 side of the Al-containing layer 40. Therefore, a higher barrier to the electrons is formed in the vicinity of the interface between the first well layer 31a and the Al-containing layer 40. Moreover, the tail portion 201 of the electron wave function WF1 of the p-type semiconductor layer 20 is contracted, and electron overflow from the first well layer 31a is efficiently suppressed. Also, the hole wave function WF2 is formed in the portion in the vicinity of the interface between the Al-containing layer 40 and the intermediate layer 50, specifically, in a portion in the vicinity of the first well layer 31a, and the holes are efficiently confined in the portion in the vicinity of the first well layer 31a. Thereby, injection efficiency of the holes into the MQW can be improved.

Through this configuration, electron overflow in the first well layer 31a can be suppressed and the injection efficiency of the holes into the MQW can be improved. Therefore, when the plurality of the well layers 31 is provided in the semiconductor light emitting device 110, luminous efficiency of the plurality of the well layers 31 can be improved.

In the semiconductor light emitting device 110 according to this embodiment, the piezoelectric effect is beneficially utilized and the suppression of electron overflow and the improvement of injection efficiency of the holes is realized due to the appropriate setting of the band gap energies of the Al-containing layer 40 and the intermediate layer 50 and of the lattice constant of the Al-containing layer 40.

For example, when using GaN for the n-type semiconductor layer 10, if, for example, InGaN is used for the well layers 31 and the barrier layer 32, compressive stress will be generated in the well layers 31 and the barrier layer 32 due to the lattice constant of InGaN being larger than GaN.

Moreover, if AlGaN is used for the Al-containing layer 40, tensile stress will be generated in the Al-containing layer 40 due to the lattice constant of AlGaN being smaller than GaN.

Generally, the lattice constant of the well layers 31 is set to be larger than the lattice constant of the n-type semiconductor layer 10. Therefore, if the lattice constant of the Al-containing layer 40 is set to be smaller than the lattice constant of the n-type semiconductor layer 10, it will result in the lattice constant of the Al-containing layer 40 being set to be smaller than the lattice constant of the well layers 31 (i.e., the first well layer 31a etc.).

Thereby, stress in mutually differing directions is generated in the mutually adjacent first well layer 31a and the Al-containing layer 40. Specifically, compressive stress is generated in the first well layer 31a and tensile stress is generated in the Al-containing layer 40.

As a result, orientation of an electric field generated by the piezo effect at the interface between the first well layer 31a and the Al-containing layer 40 is reversed. This electric field acts in a direction of confining electrons in the first well layer 31a, and results in the effective suppression of electron overflow from the first well layer 31a. Moreover, holes are made to exist in the vicinity of the first well layer 31a and the injection efficiency of the holes into the MQW can be improved.

In the semiconductor light emitting device 110 according to this embodiment, the n-type semiconductor layer 10, the first barrier layer 32a, the first well layer 31a, the Al-containing layer 40, the intermediate layer 50, and the p-type semiconductor layer 20 are subsequently disposed along the [0001] direction of the n-type semiconductor layer 10 (the +Z-axis direction), and the lattice constant of the Al-containing layer 40 is set to be smaller than the n-type semiconductor layer 10, specifically, smaller than the first well layer 31a. Therefore, the characteristics described above are obtained.

Moreover, by causing the band gap energy of the intermediate layer 50 to increase along the +Z-axis direction, appropriate energy barriers to the electrons and the holes can be formed and the injection efficiency of the holes can be improved while suppressing electron overflow.

In a semiconductor light emitting device using a group III nitride semiconductor, a high bias is applied for injecting holes into an active layer. As a result, electrons may overflow from the active layer, an ineffective current of the p-type semiconductor layer 20 may increase, and luminous efficiency may decrease. Through this embodiment, electron overflow can be suppressed, the injection efficiency of holes can be improved, and luminous efficiency can be improved.

While various configurations have been proposed wherein a barrier layer for preventing electron overflow is provided on the p-type semiconductor layer side of the active layer or in the p-type semiconductor layer, the configuration of this embodiment is not known.

For example, there is a configuration wherein an n-side intermediate layer is disposed on an n-type semiconductor layer side of an active layer, a p-side intermediate layer is disposed on a p-type semiconductor layer side of the active layer, and Al compositions and In compositions of the n-side intermediate layer and the p-side intermediate layer vary along a thickness direction. However, optimum conditions regarding the relationship between the crystal orientation of the semiconductor layers and the incline direction of the Al composition and the In composition are not known.

For example, the incline direction of the In composition ratio of the reverse inclined layer 59r of the semiconductor light emitting device 119b of the second reference example is opposed to the incline direction of the In composition ratio of the intermediate layer 50 of the semiconductor light emitting device 110 according to this embodiment. Moreover, as illustrated in FIGS. 8A and 8B, the characteristics of the semiconductor light emitting device 119b of the second reference example are lower than the characteristics of the semiconductor light emitting device 110 according to this embodiment.

Thus, in the semiconductor light emitting device 110 according to this embodiment, by appropriately designating the incline of the band gap energy (in other words, the incline of the In composition ratio) of the intermediate layer 50 by association with the [0001] direction of the n-type semiconductor layer 10, a high luminous efficiency is gained.

As previously described with respect to FIG. 13, there is a relationship between the incline direction of the In composition ratio of the composition inclined layer having an inclined composition and, for example, the injection efficiency of carriers into the first well layer 31a. Therefore, if the incline direction of the In composition ratio is inappropriate, the luminous efficiency cannot be sufficiently improved.

Therefore, in the semiconductor light emitting device 110, the incline direction of the band gap energy of the intermediate layer 50 (in other words, the incline direction of the In composition ratio of the intermediate layer 50) is determined by association with the direction of the crystal orientation of the n-type semiconductor layer 10.

Figure 14:
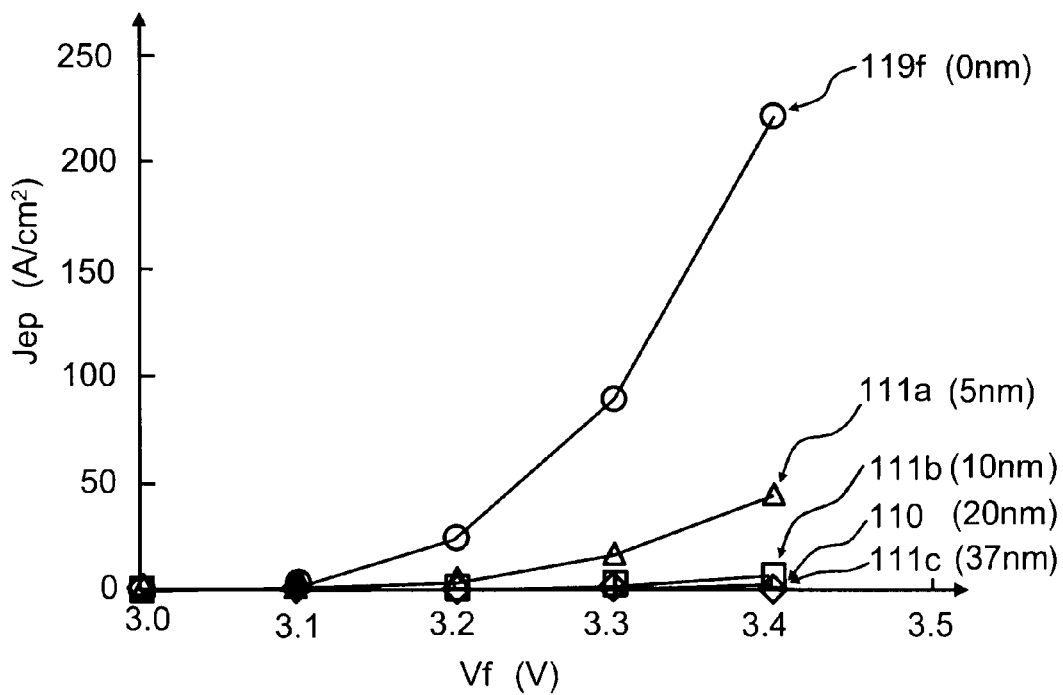
FIG. 14 is a graph illustrating the characteristics of semiconductor light emitting devices.

FIG. 14 is a graph illustrating the characteristics of semiconductor light emitting devices.

This graph shows the simulations results of the characteristics of the semiconductor light emitting devices according to the embodiment when the thickness of the intermediate layer 50 is changed. Here, as illustrated in FIG. 4, a total of the thicknesses of the intermediate layer 50 and the p-side barrier layer 32p are constant at 37 nm. In other words, a total of the thicknesses of the Al-containing layer 40, the intermediate layer 50, and the p-side barrier layer 32p are constant at 40 nm.

A semiconductor light emitting device 111a is defined where the thickness of the intermediate layer 50 is 5 nm (the thickness of the p-side barrier layer 32p is 32 nm). A semiconductor light emitting device 111b is defined where the thickness of the intermediate layer 50 is 10 nm (the thickness of the p-side barrier layer 32p is 27 nm). A semiconductor light emitting device 111c is defined where the thickness of the intermediate layer 50 is 37 nm (the thickness of the p-side barrier layer 32p is 0 nm). The semiconductor light emitting device 110 is defined where the thickness of the intermediate layer 50 is 20 nm (the thickness of the p-side barrier layer 32p is 17 nm).

In the semiconductor light emitting devices 110 and 111a to 111c, the In composition ratio of the ends of the intermediate layer 50 were 0.03 and 0.01, respectively, and the In composition ratio varied in a linear manner along the +Z-axis direction. In other words, the incline of the change of the In composition ratio varied with the thickness of the intermediate layer 50.

Characteristics of a semiconductor light emitting device 119f of the sixth reference example are also shown in FIG. 14. In the semiconductor light emitting device 119f, the Al-containing layer 40 is provided in contact with the first well layer 31a, but the intermediate layer 50 is not provided (the thickness of the intermediate layer 50 is the equivalent of 0 nm). Also, the p-side barrier layer 32p, having a thickness of 37 nm, is provided in contact with the Al-containing layer 40.

In FIG. 14, operating voltage Vf is shown on the horizontal axis, and electron current density Jep in the p-side electrode 80 is shown on the vertical axis. The electron current density Jep is equivalent to a degree of electron overflow. When the electron current density Jep is small, the overflow of the electrons is small.

As illustrated in FIG. 14, in the semiconductor light emitting device 119f in which the intermediate layer 50 is not provided, the electron current density Jep is extremely high and electron overflow is great.

On the other hand, in the semiconductor light emitting devices 110 and 111a to 111c, the electron current density Jep is small, and electron overflow is suppressed.

The thickness of the intermediate layer 50 is preferably 5 nm or more. Thereby, electron overflow can be suppressed. The thickness of the intermediate layer 50 is more preferably 10 nm or more. Thereby, electron overflow can be further suppressed, and a state can be realized in which there is substantially no electron overflow.

The thickness of the intermediate layer 50 is preferably 100 nm or less. If the thickness of the intermediate layer 50 exceeds 100 nm, for example, the driving voltage Vf will rise and it will not be possible to obtain the desired specification.

Preferably, the intermediate layer 50 is substantially free of Al. Particularly, because the first portion 55 on the first well layer 31a side of the intermediate layer 50 does not contain Al, the band gap energy of the first portion 55 can be sufficiently reduced, thus clearly differentiating the band gap energies of the interface between the intermediate layer 50 and an Al inclined layer 40. Additionally, because the first portion 55 does not contain Al, the band gap energy of the first portion 55 can be sufficiently reduced, thus clearly facilitating the forming of the incline of the band gap energy in the intermediate layer 50.

As described above, AlGaInN is used, for example, for the Al-containing layer 40.

An Al composition ratio of the Al-containing layer 40 (Al-containing layer Al composition ratio x1) is not less than 0.001 and not more than 0.3. If the Al-containing layer Al composition ratio x1 is less than 0.001, the band gap energy of the Al-containing layer 40 will not be sufficiently larger than the band gap energy of the barrier layers 32 and the efficiency improvements described above will be difficult to obtain. If the Al-containing layer Al composition ratio x1 exceeds 0.3, the barriers to the holes will also increase, which may cause to inhibit the injection efficiency of the holes into the MQW. Additionally, crystallinity may deteriorate, resulting in a reduction in efficiency. The Al-containing layer 40 need not include In, and an In composition ratio may be set to 0.

A thickness of the Al-containing layer 40 is not less than 1 nm and not more than 50 nm. If the thickness of the Al-containing layer 40 is less than 1 nm, the efficiency improvements described above will be difficult to obtain. If the thickness of the Al-containing layer 40 exceeds 50 nm, the Al-containing layer 40 will become highly resistive and the operating voltage will increase. Additionally, crystallinity may deteriorate, resulting in a reduction in efficiency.

In the example described above, the band gap energy, or in other words, the In composition ratio of the intermediate layer 50 varied in a linear manner but the embodiment is not limited thereto. The band gap energy and the In composition ratio of the intermediate layer 50 may, for example, vary in a curved manner.

FIGS. 15A to 15D are schematic diagrams illustrating configurations of semiconductor light emitting devices according to the embodiment.

Figure 15A:
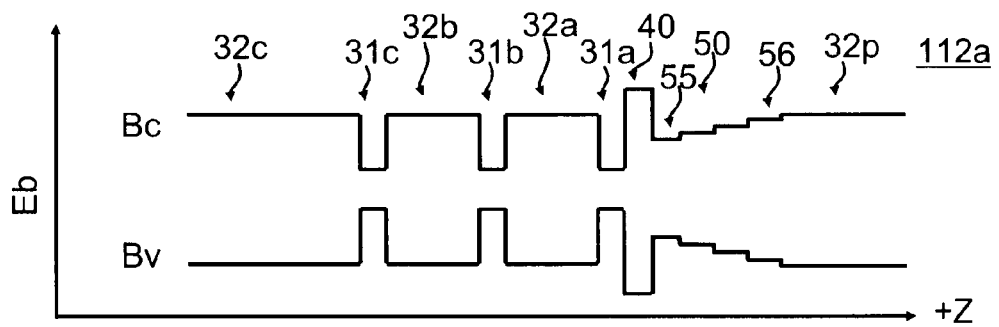
FIGS. 15A to 15D are schematic diagrams illustrating semiconductor light emitting devices according to the embodiment.
Figure 15B:
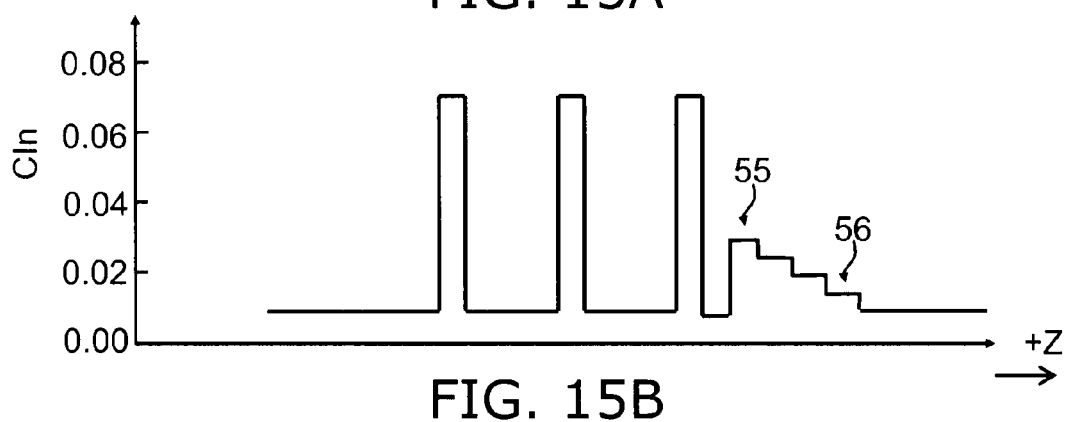
Figure 15C:
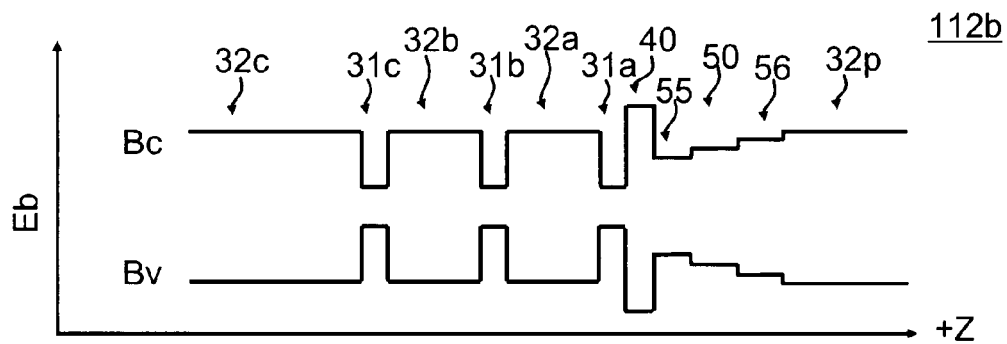
Figure 15D:
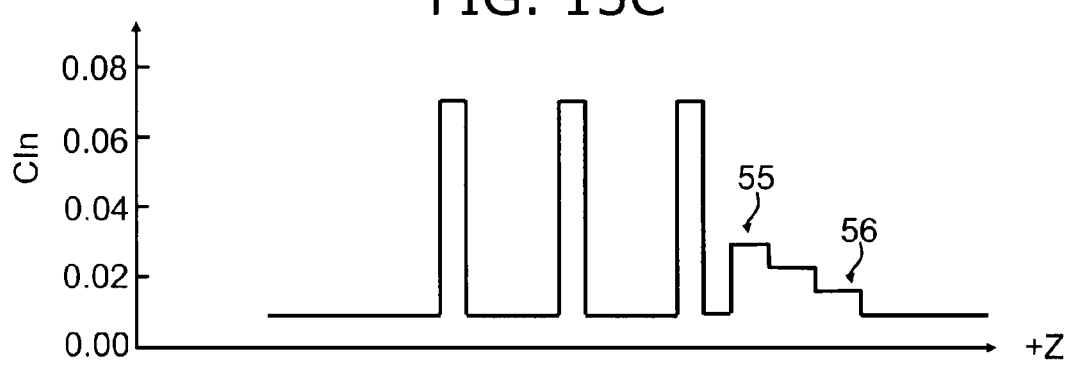

Specifically, FIGS. 15A and 15B illustrate a band gap energy and an In composition ratio of another semiconductor light emitting device 112a according to the embodiment. FIGS. 15C and 15D illustrate a band gap energy and an In composition ratio, respectively, of still another semiconductor light emitting device 112b according to the embodiment.

As illustrated in FIGS. 15A and 15B, in the semiconductor light emitting device 112a, the band gap energy and the In composition ratio of the intermediate layer 50 have four steps and vary in a stepwise manner.

As illustrated in FIGS. 15C and 15D, in the semiconductor light emitting device 112b the band gap energy and the In composition ratio of the intermediate layer 50 have three steps and vary in a stepwise manner.

Thus, the band gap energy and the In composition ratio of the intermediate layer 50 may vary in a stepwise manner. A difference in the In composition ratios and the band gap energies at each step need not be uniform, and that the manner in which the band gap energy and the In composition ratio varies may be selected as desired.

Thus, the intermediate layer 50 can include a plurality of sublayers which have mutually differing band gap energies and In composition ratios. The number of the plurality of sublayers may be determined as desired.

The Al-containing layer 40 may have a stacked structure.

FIGS. 16A to 16D are schematic diagrams illustrating configurations of other semiconductor light emitting devices according to the embodiment.

Figure 16A:
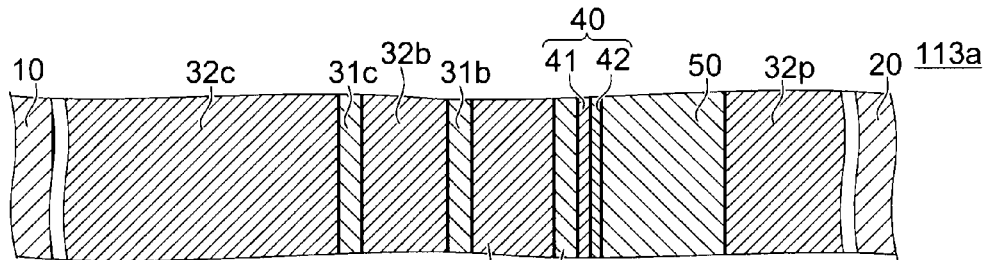
FIGS. 16A to 16D are schematic diagrams illustrating semiconductor light emitting devices according to the embodiment.
Figure 16B:
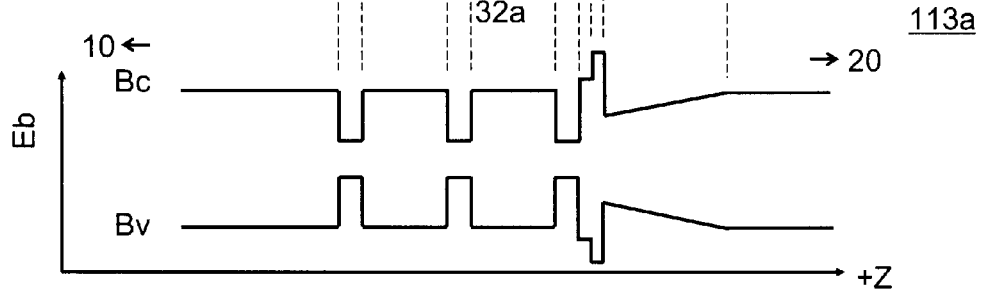
Figure 16C:
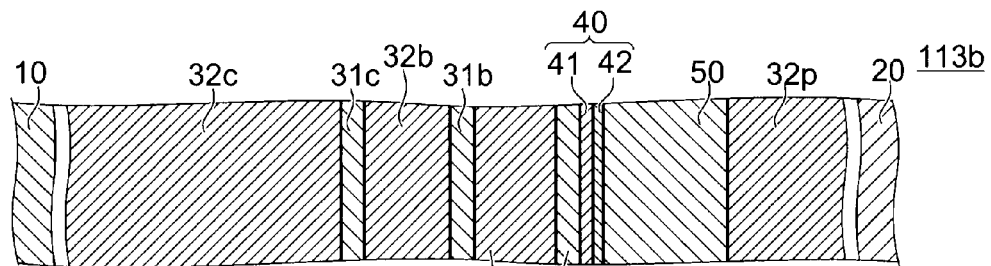
Figure 16D:
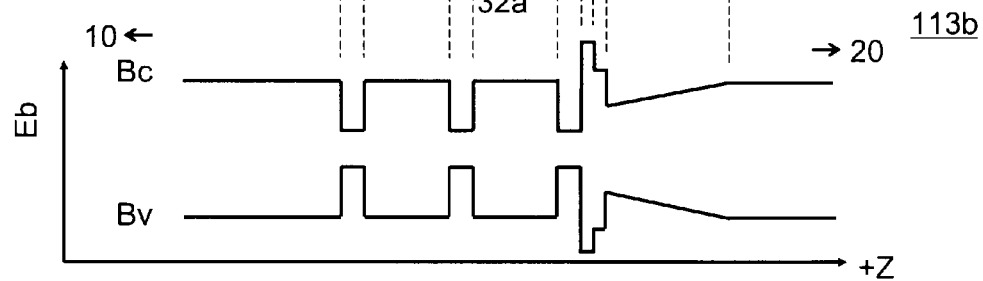

FIG. 16A is a schematic cross-sectional view illustrating a configuration of another semiconductor light emitting device 113a according to the embodiment and FIG. 16B illustrates a band gap energy of the semiconductor light emitting device 113a. FIG. 16C is a schematic cross-sectional view illustrating a configuration of still another semiconductor light emitting device 113b according to the embodiment and FIG. 16D illustrates a band gap energy of the semiconductor light emitting device 113b.

As illustrated in FIGS. 16A to 16D, in the semiconductor light emitting device 113a and the semiconductor light emitting device 113b, the Al-containing layer 40 includes a first layer 41 and a second layer 42. The first layer 41 is in contact with the first well layer 31a. The second layer 42 is in contact with the first layer 41 and the second layer 42 is between the first layer 41 and the intermediate layer 50. The second layer 42 has a band gap energy that differs from a band gap energy of the first layer 41.

Specifically, in the semiconductor light emitting device 113a, the band gap energy of the second layer 42 is larger than the band gap energy of the first layer 41. In the semiconductor light emitting device 113b, the band gap energy of the second layer 42 is smaller than the band gap energy of the first layer 41.

Thus, the Al-containing layer 40 displays the same characteristics as described above even when having a stacked structure in which the plurality of layers have mutually differing band gap energies. Specifically, electron overload is suppressed and injection efficiency of holes is improved.

For example, because an Al composition ratio of the first layer 41 and an Al composition ratio of the second layer 42 are different, the band gap energy of the first layer 41 and the band gap energy of the second layer 42 are different.

By changing the Al composition ratios of the first layer 41 and the second layer 42, lattice constants of the first layer 41 and the second layer 42 change. If a crystal having a large lattice constant (the well layer and the second portion 56 on the p-type semiconductor layer 20 side of the intermediate layer 50) is grown in contact with a crystal having a small lattice constant (the Al-containing layer 40), defects and dislocations will easily occur at an interface therebetween. Here, by providing the Al-containing layer 40 with the first layer 41 and the second layer 42, a layer having a lattice constant between the crystal having the large lattice constant and the crystal having the small lattice constant can be provided. Thus, the occurrence of defects and dislocations can be suppressed and luminous efficiency can be improved more.

As illustrated in FIG. 4, in the semiconductor light emitting device 110 according to this embodiment, the characteristics of suppressing electron overflow and improving the injection efficiency of the holes is based on appropriately controlling the state (states of the barrier, the electron wave function WF1, and the hole wave function WF2) of the first well layer 31a, which is the closest to the p-type semiconductor layer 20 among the well layers 31, by providing the Al-containing layer 40 and the intermediate layer 50. In other words, while the state of the first well layer 31a, which is the closest to the p-type semiconductor layer 20 among the well layers 31, is greatly affected by the Al-containing layer 40 and the intermediate layer 50, the other well layers 31 (i.e. second well layer 31b and third well layer 31c) are not greatly affected. Therefore, the characteristics of suppressing electron overflow and improving the injection efficiency of the holes obtained by providing the Al-containing layer 40 and the intermediate layer 50 are also displayed in a configuration in which one of the well layers 31 is provided (Single Quantum Well structure).

As described above, according to the embodiment, a semiconductor light emitting device having improved luminous efficiency can be provided.

Note that in this specification, the term, "nitride semiconductor" includes semiconductors of all compositions wherein composition ratios of x, y, and z in the formula $B_xIn_yAl_zGa_{1-x-y-z}N$ fall within the respective ranges of $0 \leq x \leq 1$, $0 \leq y \leq 1$, $0 \leq z \leq 1$, and $x+y+z \leq 1$. Furthermore, in the formula described above, "nitride semiconductor" shall also be understood to include semiconductors further including group V elements other than N (nitrogen), semiconductors further including various elements added to control various physical properties such as conductivity type and the like, and semiconductors further including various elements that are included unintentionally.

An embodiment of the invention with reference to examples was described above. However, the invention is not limited to these examples. For example, the scope of the invention includes all cases in which, for example, a person skilled in the art could make use of publicly known information to appropriately select constituents such as the n-type semiconductor layer, p-type semiconductor layer, well layers, barrier layers, Al-containing layer, intermediate layer, electrodes and the like included in the semiconductor light emitting device provided that the obtained effects are similar.

Additionally, combinations of constituents from two or more of the examples are also included in the scope of the invention, provided they are technically possible and do not depart from the spirit of the invention.

Beside such cases, all semiconductor light emitting devices based on the embodiments of the invention described above that are obtainable through appropriate design modifications by a person skilled in the art shall be understood to fall within the scope of the invention, provided such semiconductor light emitting devices do not depart from the spirit of the invention.

Furthermore, regarding the scope of the spirit of the invention, it is understood that a variety of variations and modifications could be conceived by a person skilled in the art and that these variations and modifications all fall within the scope of the invention as well.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor light emitting device comprising:
an n-type semiconductor layer including a nitride semiconductor;
a p-type semiconductor layer provided on a side of [0001] direction of the n-type semiconductor layer and including a nitride semiconductor;
a first well layer provided between the n-type semiconductor layer and the p-type semiconductor layer, the first well layer having a band gap energy smaller than a band gap energy of the n-type semiconductor layer and smaller than a band gap energy of the p-type semiconductor layer, and including a nitride semiconductor;
a first barrier layer provided between the first well layer and the n-type semiconductor layer, in contact with the first well layer, the first barrier layer having a band gap energy larger than the band gap energy of the first well layer, and including a nitride semiconductor;
an Al-containing layer provided between the first well layer and the p-type semiconductor layer, in contact with the first well layer, the Al-containing layer having a band gap energy larger than the band gap energy of the first barrier layer, having a lattice constant smaller than a lattice constant of the n-type semiconductor layer, and having a composition of $Al_{x1}Ga_{1-x1-y1}In_{y1}N$ (where $0<x1<1$ and $0 \leq y1<1$); and
an intermediate layer provided between the Al-containing layer and the p-type semiconductor layer, in contact with the Al-containing layer, having a band gap energy larger than the band gap energy of the first well layer, and including a nitride semiconductor, the intermediate layer having a first portion and a second portion provided between the first portion and the p-type semiconductor layer, a band gap energy of the first portion being smaller than a band gap energy of the second portion.

2. The device according to claim 1, wherein the band gap energy of the first portion is smaller than or equal to the band gap energy of the p-type semiconductor layer.

3. The device according to claim 1, wherein the band gap energy of the intermediate layer increases along a direction from the Al-containing layer toward the p-type semiconductor layer.

4. The device according to claim 1, wherein an In composition ratio of the intermediate layer decreases along a direction from the Al-containing layer toward the p-type semiconductor layer.

5. The device according to claim 1, wherein a thickness of the intermediate layer is not less than 5 nanometers and not more than 100 nanometers.

6. The device according to claim 1, wherein an In composition ratio of the first portion is higher than 0 and lower than an In composition ratio of the first well layer.

7. The device according to claim 1, wherein the intermediate layer does not include Al.

8. The device according to claim 1, wherein the first portion does not include Al.

9. The device according to claim 1, wherein an Al composition ratio of the Al-containing layer is not less than 0.001 and not more than 0.03.

10. The device according to claim 1, wherein a thickness of the Al-containing layer is not less than 1 nanometer and not more than 50 nanometers.

11. The device according to claim 1, wherein the Al-containing layer does not include In.

12. The device according to claim 1, wherein the Al-containing layer includes:
a first layer in contact with the first well layer; and
a second layer in contact with the first layer between the first layer and the intermediate layer and having a different band gap energy from a band gap energy of the first layer.

13. The device according to claim 12, wherein the band gap energy of the second layer is larger than the band gap energy of the first layer.

14. The device according to claim 12, wherein the band gap energy of the second layer is smaller than the band gap energy of the first layer.

15. The device according to claim 1, wherein a wavelength of light emitted from the first well layer is not less than 330 nanometers and not more than 580 nanometers.

16. The device according to claim 1, wherein a thickness of the first well layer is not less than 1 nanometer and mot more than 10 nanometers.

17. The device according to claim 1, wherein a thickness of the first barrier layer is not less than 3 nanometers.

18. The device according to claim 1, wherein an In composition ratio of the first barrier layer is not higher than an In composition ratio of the first well layer.

19. The device according to claim 1, wherein an In composition ratio of the first barrier layer is not lower than 0.005.

20. The device according to claim 1, further comprising:
a second well layer provided between the first barrier layer and the n-type semiconductor layer, in contact with the first barrier layer, the second well layer having a band gap energy smaller than the band gap energy of the first barrier layer, smaller than the band gap energy of the Al-containing layer, and smaller than the band gap energy of the intermediate layer, and the second well layer including a nitride semiconductor; and
a second barrier layer provided between the second well layer and the n-type semiconductor layer, in contact with the second well layer, the second barrier layer having a band gap energy larger than the band gap energy of the second well layer and smaller than the band gap energy of the Al-containing layer, and the second barrier layer including a nitride semiconductor.

21. The device according to claim 1, wherein an In composition ratio in the intermediate layer decreases continuously along a direction from the Al-containing layer toward the p-type semiconductor layer.

22. The device according to claim 1, wherein an In composition ratio in the intermediate layer decreases in a stepwise along a direction from the Al-containing layer toward the p-type semiconductor layer.

23. The device according to claim 1, wherein the intermediate layer includes an undoped InGaN.

* * * * *